United States Patent
Soejima et al.

(10) Patent No.: US 8,114,766 B1
(45) Date of Patent: Feb. 14, 2012

(54) METHOD FOR MANUFACTURING SEMICONDUCTOR DEVICE

(75) Inventors: Koji Soejima, Kanagawa (JP); Yoichiro Kurita, Kanagawa (JP); Masaya Kawano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/498,664

(22) Filed: Jul. 7, 2009

Related U.S. Application Data

(62) Division of application No. 11/522,330, filed on Sep. 18, 2006, now abandoned.

(60) Provisional application No. 60/717,745, filed on Sep. 19, 2005.

(51) Int. Cl.
*H01L 21/4763* (2006.01)

(52) U.S. Cl. ................... 438/618; 257/E21.586

(58) Field of Classification Search ............ 438/618
See application file for complete search history.

(56) References Cited

U.S. PATENT DOCUMENTS

| | | | |
|---|---|---|---|
| 2003/0157810 A1* | 8/2003 | Honda | 438/745 |
| 2005/0153533 A1 | 7/2005 | Hoshino et al. | |
| 2005/0269708 A1 | 12/2005 | Andricacos et al. | |

FOREIGN PATENT DOCUMENTS

| | | |
|---|---|---|
| JP | 8-167629 | 6/1996 |
| JP | 2003-309215 | 10/2003 |

OTHER PUBLICATIONS

English translation of Japanese patent No. 2003-309215, Oct. 2003.
English translation of Japanese patent No. 08-167629, Jun. 1996.

* cited by examiner

*Primary Examiner* — Quoc D Hoang
*Assistant Examiner* — Tony Tran
(74) *Attorney, Agent, or Firm* — Young & Thompson

(57) ABSTRACT

Method of manufacturing a semiconductor device, which achieves a reduction in manufacturing cost and prevents, a damage on the interconnect layer by an influence of the etchant solution, since the support substrate can be easily stripped from the interconnect layer. The method of manufacturing a semiconductor device includes: forming an interconnect film, by forming a seed metal layer on a support substrate and a protective film contacting with an end of an interface between the support substrate and the seed metal layer, and by growing a plated material from a surface of the seed metal layer; mounting a semiconductor chip on the interconnect film; removing at least a portion of the protective film to form a region where the support substrate and the seed metal layer are exposed; and stripping the support substrate from the region as a starting point to remove thereof from the seed metal layer.

17 Claims, 42 Drawing Sheets

METHOD FOR MANUFACTURING SEMICONDUCTOR DEVICE

This application is a divisional of application Ser. No. 11/522,330 filed Sep. 18, 2006, now abandoned, which claims priority under 35 U.S.C. §119 from U.S. Provisional Application Ser. No. 60/717,745, filed Sep. 19, 2005.

BACKGROUND

1. Technical Field

The present invention relates to a method for manufacturing a semiconductor device, which includes a semiconductor chip mounted on an interconnect substrate.

2. Related Art

Typical conventional process for manufacturing a semiconductor device that includes a semiconductor chip mounted on an interconnect substrate includes, for example, technologies disclosed in Japanese Patent Laid-Open No. H8-167,629 (1996) and Japanese Patent Laid-Open No. 2003-309,215. In the process described in Japanese Patent Laid-Open No. H8-167,629, a patterned interconnect is formed on a substrate for transfer, and then a resin seal is formed while a condition of a semiconductor chip mounted on the interconnect is maintained, and subsequently, the substrate for transfer is stripped off with a stress to manufacture a semiconductor device.

In a process described in Japanese Patent Laid-Open No. 2003-309,215, as illustrated in FIGS. 42A and 42B, an etchback layer 102 containing Cu as a major constituent and a multiple-layered interconnect board 104 are first deposited on a support substrate 100 composing of silicon or the like (FIG. 42A). Subsequently, stiffening plates 106 are formed on the multiple-layered interconnect board 104, and the etchback layer 102 is removed via a wet etch process from an exposed end thereof, thereby separating the support substrate 100 from the multiple-layered interconnect board 104 (FIG. 42B). Thereafter, semiconductor chips (not shown) are mounted between the stiffening plates 106 on this multiple-layered interconnect board 104 to manufacture a semiconductor device.

However, there is still a room for an improvement in the conventional technologies described above, in view of the following points.

Since the substrate for transfer is strongly adhered with the interconnect layer in the process described in Japanese Patent Laid-Open No. H8-167,629, it is not easy to strip the substrate for transfer off by employing a stress, and an interconnect layer may be damaged by a stress utilized for the stripping.

On the other hand, in the process described in Japanese Patent Laid-Open No. 2003-309,215, the etchback layer 102 is removed from an end thereof via wet etch process.

Therefore, a certain time is required for removing the etchback layer 102, leaving a room for an improvement in reducing the manufacturing cost. Further, since an operation for dipping the multiple-layered interconnect layer 104 in an etchant solution for longer time is required, the multiple-layered interconnect layer 104 may be often damaged.

As such, there are rooms for improvements in view of reducing a manufacturing cost and in view of preventing the interconnect layer from being damaged in the conventional process for manufacturing the semiconductor device.

Further, since the stripping process is carried out by applying a stress over the support substrate in the process described in Japanese Patent Laid-Open No. H8-167,629, the support substrate may be often damaged, and the support substrate can not often be reused. In addition, since the operation for dipping the support substrate in the etchant solution for longer time is required in the process described in Japanese Patent Laid-Open No. 2003-309,215, and an effective reuse of the support substrate can not be achieved.

As described above, there still be a room for an improvement in view of an effective reuse of the support substrate in the conventional process for manufacturing the semiconductor device.

SUMMARY OF THE INVENTION

According to one aspect of the present invention, there is provided a method for manufacturing a semiconductor device, comprising: forming an interconnect film, by forming a seed metal layer on a support substrate and a protective film contacting with an end of an interface between the support substrate and the seed metal layer, and by growing a plated material from a surface of the seed metal layer; mounting a semiconductor chip on the interconnect film; forming a region where the support substrate and the seed metal layer are exposed by removing at least a portion of the protective film; and stripping the support substrate from the region as a starting point to remove thereof from the seed metal layer.

According to the above-described aspect of the present invention, an end of the interface between the support substrate and the seed metal layer is protected by the protective film. Therefore, when it is configured to easily occur a stripping at the interface between the support substrate and the seed metal layer and further to protect an end of the interface, a stripping of the support substrate from the seed metal layer by an influence of a stress or an etchant solution would not occur until the stripping operation in the manufacturing process is conducted. Further, such protective film is removed in the stripping operation, so that the support substrate can also be easily stripped from the seed metal layer. Therefore, the stripping operation can be carried out in a shorter time, so that the manufacturing cost would be reduced and a damage to the interconnect layer by an influence of the etchant solution would be avoided.

Since the stripping of the support substrate from the seed metal layer can be easily achieved in the present invention as described above, damage on the support substrate can be avoided, and further, a dip of the support substrate in the etchant solution for longer time is not required. Therefore, an effective reuse of the support substrate can be achieved.

Since the support substrate can be easily stripped from the interconnect layer according to the present invention, the manufacturing cost can be reduced and further, a damage on the interconnect layer by an influence of the etchant solution can be avoided. Further, an effective reuse of the support substrate can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented. A process for manufacturing a semiconductor device will be described as follows in first to third embodiments.

First Embodiment

Figure 3J:
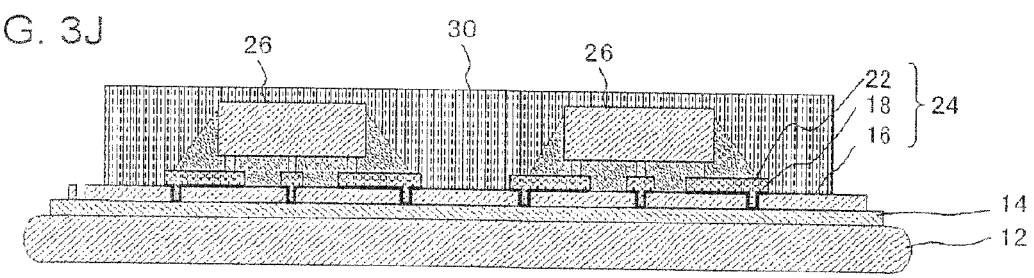
Figure 4K:
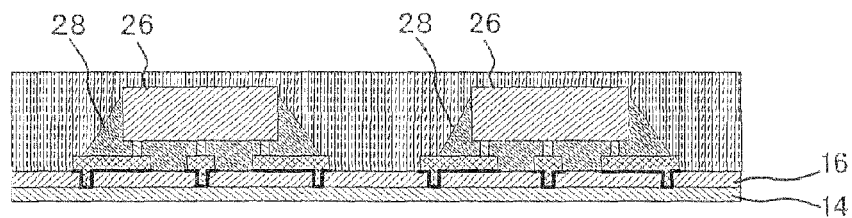
FIGS. 4K to 4M are cross-sectional views of the semiconductor device, illustrating the process for manufacturing the semiconductor device according to first embodiment.
Figure 4L:
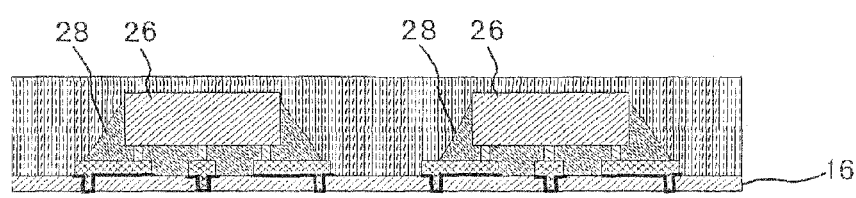

A method for manufacturing a semiconductor device in first embodiment includes the following process operations:

(i) forming interconnect films 22, by forming a seed metal layer 14 on a support substrate 12 and a protective film (resist film) contacting with an end of an interface between the support substrate 12 and the seed metal layer 14, and by growing plated material from a surface of the seed metal layer 14 (FIG. 1A to FIG. 2F);

(ii) mounting semiconductor chips 26 on the interconnect films 22 (FIG. 2G to FIG. 3I);

(iii) forming a region where the support substrate 12 and the seed metal layer 14 are exposed by removing at least a portion of the protective film (FIG. 3J); and (iv) stripping the support substrate 12 from a starting point of the above-described region to remove thereof from the seed metal layer 14 (FIG. 4K).

Descriptions will be made as follows, along respective operations.

Figure 1A:
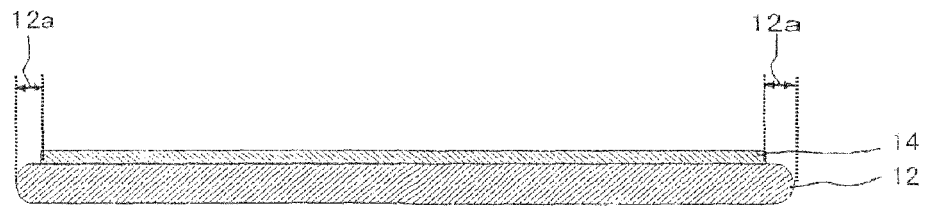
FIGS. 1A to 1D are cross-sectional views of a semiconductor device, illustrating a process for manufacturing the semiconductor device according to first embodiment.

First of all, a seed metal layer 14 is formed on a surface of a support substrate 12 except circumference portions 12a thereof (FIG. 1A). A substrate including silicon dioxide ($SiO_2$) in the outer layer of the substrate may be employed for the support substrate 12. Such type of materials includes a quartz substrate, a glass substrate, a silicon substrate having a stripping layer formed on the surface thereof and the like. Typical stripping layer may be a silicon oxide film, and the silicon oxide film may be formed by a process for thermally oxidizing a silicon substrate, or by a chemical vapor deposition (CVD) process.

By forming the silicon oxide film on the surface of the support substrate 12 in this way, an adherence between the support substrate 12 and the seed metal layer 14 is reduced by a baking process in the process for forming the insulating resin layer as discussed later, thereby achieving an easy stripping.

The seed metal layer 14 serves as an electrically feeding layer in the process for forming interconnect films 22 via an electrolytic plating process, and is also employed as a stripping layer formed between the support substrate 12 and the interconnect layer 24. The seed metal layer 14 is formed on the support substrate 12 via a sputter process or the like. The seed metal layer 14 may be formed of copper (Cu), copper-vanadium (Cu—V) alloy, nickel (Ni) or the like.

The seed metal layer 14 is formed in regions except the circumference portions 12a of the support substrate 12.

The width of the circumference portion 12a is within a range of from about 0.1 ram to 2 mm.

Figure 1B:
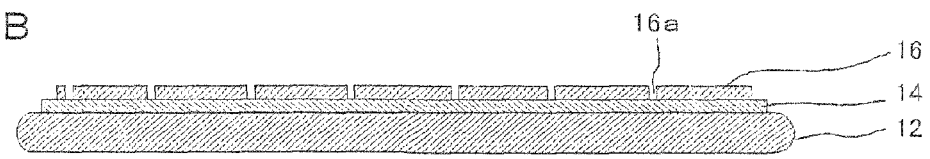

Subsequently, an insulating resin such as a photosensitive polyimide and the like is applied on the seed metal layer 14, and then, a developing and an exposure processes are conducted to form a predetermined pattern, thereby forming via holes 16a in predetermined locations on the insulating resin. Further, such insulating resin is baked to form an insulating film 16 having via holes 16a in predetermined locations (FIG. 1B). The baking temperature may be, for example, within a range of from about 300 degree C. to about 400 degree C. This facilitates a stripping at the interface between the support substrate 12 and the seed metal layer 14. In addition to above, after forming the insulating film 16, slits may also be formed in portions of the insulating film 16 protected by a resist film 20 with a laser beam or the like in advance. The slits may be formed to reach the support substrate 12. In the step for stripping the support substrate 12 from the seed metal layer 14, the slits are exposed and then the slits are utilized as a starting point, such that the stripping of these members would be easily carried out.

Figure 1C:
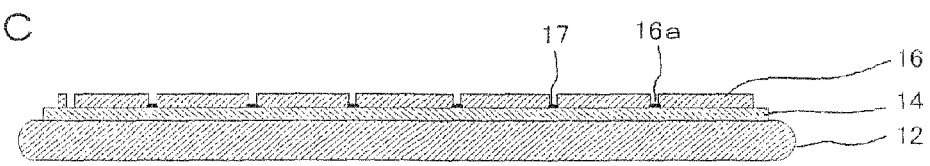
Figure 1D:
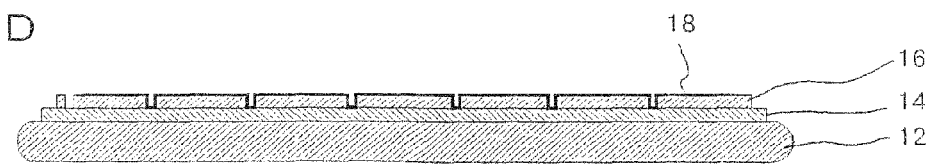

Subsequently, an electrolytic plating, for example, is conducted to plate copper (Cu) and nickel (Ni) in interiors of the via holes 16a, thereby forming plated films 17 in bottoms of the via holes 16a (FIG. 1C). Further, a seed sputter, film 18 is formed on the surface of insulating film 16 so as to cover interior walls of the via holes 16a (FIG. 1D). The seed sputter film 18 is composed of a dual-layer film, which may be constituted by, for example, forming a titanium (Ti) film and then forming a Cu film thereon. The resultant constitution is referred to as "Ti/Cu".

After forming the seed sputter film 18, a resist film (not shown) having a predetermined pattern for forming the interconnect films 22 is formed, so as cover the surfaces of the seed metal layer 14, the insulating films 16 and the seed sputter film 18 and to cover the circumference portions 12a. Further, the resist film includes an additional pattern formed therein, so that an opening would be formed at a spot where an electrically coupling to the seed metal layer 14 is provided, when an electrolytic plating process is conducted for forming the interconnect films 22.

Subsequently, the via holes 16a are filled, and the pattern formed in the resist film 20 is also filled to form the interconnect films 22. The formation of the interconnect films 22 may be conducted by, for example, an electrolytic plating process utilizing the seed metal layer 14 as an electrically feeding layer.

The electrolytic plating process is conducted by, for example, fixing the support substrate 12 to a support jig 42, as shown in FIG. 2B. The support jig 42 presses the support substrate 12 from the side of the back surface thereof to fix the support substrate 12 into the support jig 42. The support jig 42 comprises a packing 44 and an electrode 46, and is electrically connected to the surface of the seed sputter film 18 via the electrode 46. Further, the support jig is configured so that the packing 44 provides a prevention of a spacing 48 between the support jig 42 and the support: substrate 12 from entering a plating solution. The support: substrate 12 is fixed to such support jig 42, and is further immersed into the plating solution to carry out the electrolytic plating process utilizing the seed metal layer 14 as an electrically feeding layer.

A metal, which is capable of exhibiting a smaller residual stress at the interface therebetween, can be employed for a metal composing the interconnect film 22. More specifically, a Ti/Cu sputter film is formed on an entire surface of a silicon wafer having a diameter of 200 mm and a thickness 725 μm, and subsequently, a metal layer having a thickness 3 μm is formed via a plating process. In this case, a metallic material, which is capable of exhibiting a bending of the silicon wafer of equal to or lower than 5 μm, may be employed. Such type of metallic materials include Cu, Cu alloy Ni, Ni alloy or the like.

A stripping can be avoided in the plating process by composing the interconnect film 22 with such metallic material, even if an adhesive force between the support substrate 12 and the insulating film 16 is reduced. Therefore, an adhesive force between the support substrate 12 and the insulating film 16 can be reduced, and thus the support substrate 12 can be easily stripped from the seed metal layer 14. Therefore, in the stripping operation of the support substrate 12 from the seed metal layer 14, the insulating film 16 and/or the interconnect film 22 are not damaged.

Figure 2E:
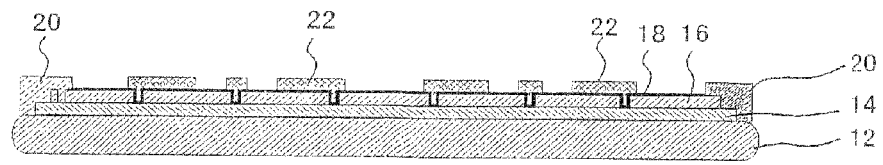
FIGS. 2E to 2G are cross-sectional views of the semiconductor device, illustrating the process for manufacturing the semiconductor device according to first embodiment.

Subsequently, a developing exposure process is conducted once again so as to leave circumference portions of the resist film 20, such that a protective film composed of a resist film 20 would be formed, which is in contact with the circumference portion 12a of the support substrate 12 and covers an end of the interface between the support substrate 12 and the seed metal layer 14 (FIG. 2E). The end of the interface may be located over the entire circumference portion of the substantially circular support substrate 12, or may be formed in a portion thereof. The entire end of the interface between the support substrate 12 and the seed metal layer 14 is covered with the protective film composed of the resist film 20.

Further, after the resist film 20 having the interconnect pattern formed therein is completely removed, a resist film is formed and a developing exposure process is conducted once again, such that a protective film composed of a resist film 20 would also be formed, which is in contact with the circumference portion 12a of the support substrate 12 and covers an end of the seed metal layer 14.

Figure 2F:
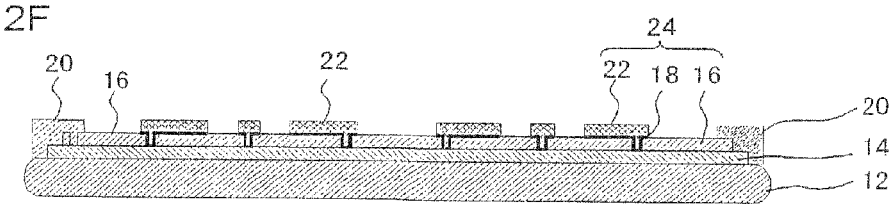

Subsequently, an etchback process for the seed sputter film 18 on the surface of the insulating film 16 is conducted (FIG. 2F).

Having such procedure, the interconnect layer 24 composed of the insulating film 16, the seed sputter film 18 and the interconnect film 22 is formed. The etchback process may be conducted via a wet etch process employing an etchant solution such as, for example, hydrogen fluoride (HF), a liquid mixture of sulfuric acid and hydrogen peroxide, and the like.

Since the protective film (resist film 20), which is in contact with the circumference portion 12a and covers the end of the seed metal layer 14 in this case, a protection for the end of the interface between the support substrate 12 and the seed metal layer 14 can be provided, thereby preventing these members from being peeled off.

Next, the semiconductor chips 26 are mounted on the interconnect films 22 (FIG. 2G to FIG. 3I).

Figure 2G:
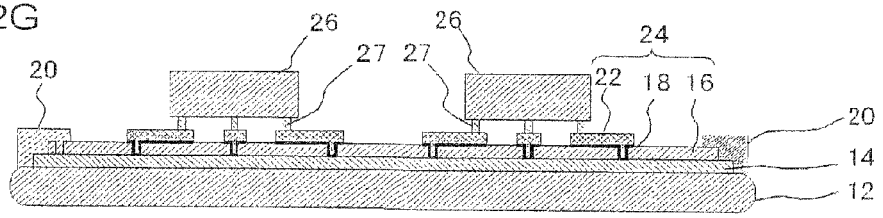
Figure 3H:
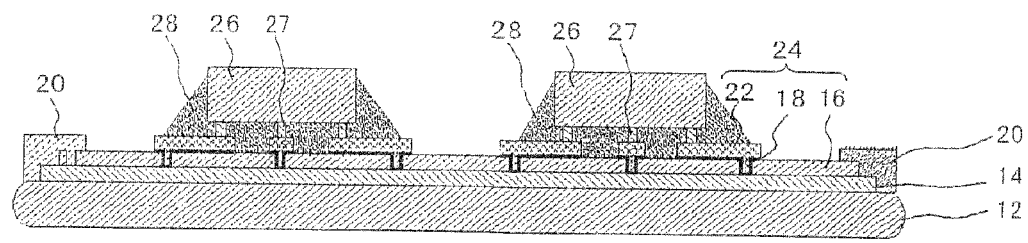
FIGS. 3H to 3J are cross-sectional views of the semiconductor device, illustrating the process for manufacturing the semiconductor device according to first embodiment.

First, electrodes 27 of the semiconductor chips 26 are connected to the interconnect films 22 (FIG. 2G). Though it is not illustrated here, in the present embodiment, a plurality of semiconductor chips 26 are fixed onto the interconnect layer 24 with a certain spacing therebetween. Thereafter, spacings between the semiconductor chips 26 and the interconnect layers 24 are filled with the underfill resin 28 (FIG. 3H).

Figure 3I:
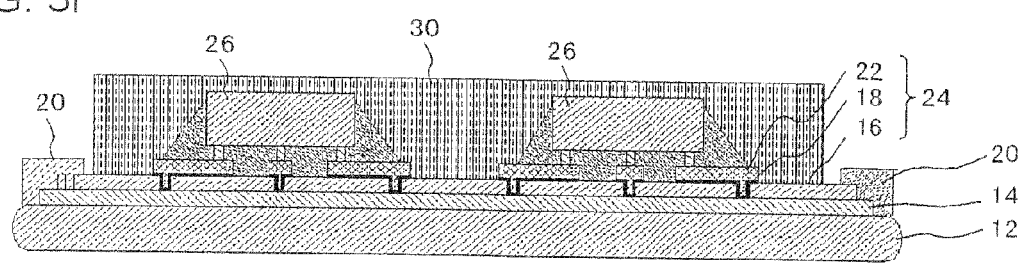

Subsequently, the device is encapsulated with an encapsulating resin 30 so as to cover these semiconductor chips 26, thereby providing the semiconductor chips 26 mounted on the interconnect layers 22 (FIG. 3I). In this case, the encapsulating process is carried out with an encapsulating resin 30 such as an epoxy resin and the like, so that the protective film (resist film 20) formed in the circumference portion 12a of the support substrate 12 would be exposed. The packaging process may be conducted via a printing process or a compression molding process.

Since larger diameter of the wafer provides larger stress due to the cure shrinkage of the resin in the encapsulating process, a resin that exhibits smaller cure shrinkage may be suitably selected for the encapsulating resin 26, in accordance with the diameter of the wafer.

Next, at least a portion of the protective film (resist film 20) is removed to form a region where the support substrate 12 and the seed metal layer 14 are exposed (FIG. 3J).

More specifically, the protective film (resist film 20) is removed by a predetermined method to expose the ends of the seed metal layer 14 and the insulating film 16. As described above, the exposed region is a region where the end portions of the interface between the support substrate 12 and the seed metal layer 14 are exposed, and is formed over the entire circumference portion of the support substrate 12. From the end portion of such interface as a basic point, the support substrate 12 can be easily stripped from the seed metal layer 14.

Further, from the above-described region as a starting point, the support substrate 12 is stripped off from the seed metal layer 14 (FIG. 4K).

More specifically, from a starting point of the end portions of the interfaces between the support substrate 12 and the seed metal layer 14 formed in the above-described region, a strip can be carried out by exerting a stress. Alternatively, a stripping starting point may be formed in the end portion of the exposed seed metal layer 14, and the support substrate 12 may be stripped from the seed metal layer 14 by exerting a stress from such stripping starting point.

The stripping starting point may be formed by removing the circumference end portion of the seed metal layer 14 via a wet etch process with an etchant solution such as a liquid mixture of sulfuric acid and hydrogen peroxide and the like. Alternatively, a mechanical-cutting, a laser-irradiation, a tape-peeling or the like may also be employed for forming the stripping starting point.

The stripping of the support substrate 12 from the seed metal layer 14 can be achieved via a stress, or alternatively, the stripping can also be achieved by utilizing a stripping solution. The stripping solutions available in this case include pure water, electrolysis cathode water, ozone water, a stripping solution exhibiting an electrical conductivity or the like. By employing a stripping solution exhibiting an electrical conductivity, a generation of a static electricity caused during the stripping of the support substrate 12 from the seed metal layer 14 can be eliminated. Typical stripping solutions exhibiting an electrical conductivity includes carbonated water, aqueous ammonia or the like. After the support substrate 12 is stripped, the stripped interconnect layer 24 may be deformed under the influence of the shrinkage of the encapsulating resin 30. Thus, this shrinkage can be compensated by suitably designing the interconnect layer 24.

Figure 4M:
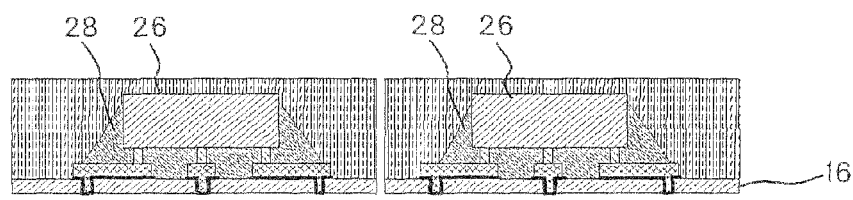

Then, the seed metal layer 14 is removed from the stripped interconnect layer 24 via an etch process (FIG. 4I). After the seed metal layer 14 is removed, a dicing process is conducted for the spacings between the semiconductor chips 26 to obtain a plurality of structural members (FIG. 4M).

In addition to above, the portions of the seed metal layer 14 remained on the support substrate 12 may be removed with nitric acid, a liquid mixture of sulfuric acid and aqueous hydrogen peroxide solution or the like, so that the support substrate 12 would be reused.

Advantageous effects obtainable by employing the configuration of first embodiment will be described as follows. According to the method for manufacturing the semiconductor device of first embodiment, the protective film (resist film 20) that is in contact with the end portion of the seed metal layer 14 and covers the circumference portion 12a is formed, so that the end portion of the interface between the support substrate 12 and the seed metal layer 14 is protected. According to such method, the stripping of the support substrate from the seed metal layer under the influence of the stress and/or the etchant solution is avoided until the stripping operation in the manufacturing process. Further, the stripping process can be easily conduct by simply eliminating the protective film, such that a reduced manufacturing cost: can be presented.

In the conventional method for manufacturing the semiconductor device (Japanese Patent Laid-Open No. 2003-309, 215), the stripping of the support substrate from the interconnect layer is conducted by dipping the device in an etchant solution and removing the etchback layer formed between the support substrate and the interconnect layer. Nevertheless, such method requires longer time for removing the etchback layer, which, in turn, increases the manufacturing cost. Further, the conventional method also requires a dip of the interconnect board in an etchant solution for longer time, which may, in turn, cause a damage of the interconnect layer.

On the contrary, according to the method for manufacturing the semiconductor device of the present embodiment, the end portion of the interface between the support substrate and the seed metal layer is protected by the protective film. Therefore, the stripping of the support substrate from the seed metal layer under the influence of the stress and/or the etchant solution is avoided until the stripping step in the manufacturing process, by providing a configuration, in which a stripping is easily caused at the interface between the support substrate and the seed metal layer and further by providing a protection on the end portion of the interface. Further, such protective film is removed in the stripping step, so that the support substrate can also be easily stripped from the seed metal layer. Therefore, the stripping operation can be carried out in a shorter time, so that the manufacturing cost would be reduced and a damage to the interconnect layer by an influence of the etchant solution would be avoided.

Further, since the stripping of the support substrate from the seed metal layer can be easily achieved in the present embodiment, damage on the support substrate can be avoided, and further, a dip of the support substrate in the etchant solution for longer time is not required. Therefore, an effective reuse of the support substrate can be achieved.

Second Embodiment

Second embodiment will be represented by second embodiment-(1) or second embodiment-(2) as follows. First of all, second embodiment-(1) will be described.

Second Embodiment-(1)

Figure 7G:
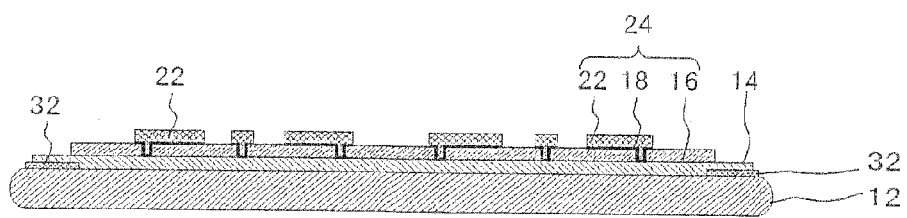
FIGS. 7G to 7I are cross-sectional views of the semiconductor device, illustrating the process for manufacturing the semiconductor device according to second embodiment-(1)
Figure 7H:
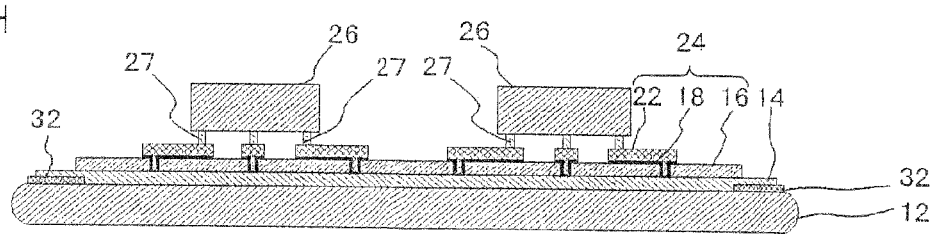
Figure 7I:
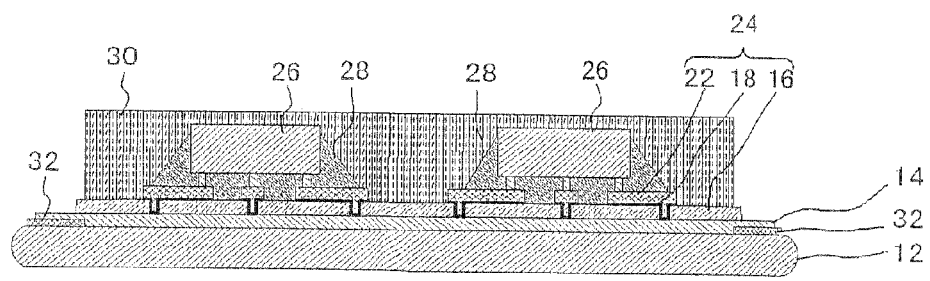
Figure 8J:
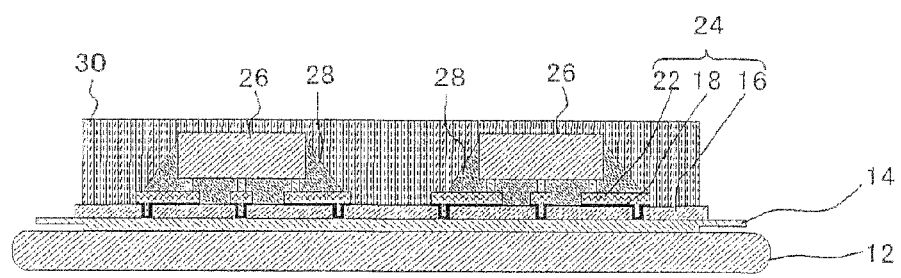
FIGS. 8J and 8K are cross-sectional views of the semiconductor device, illustrating the process for manufacturing the semiconductor device according to second embodiment-(1)
Figure 8K:
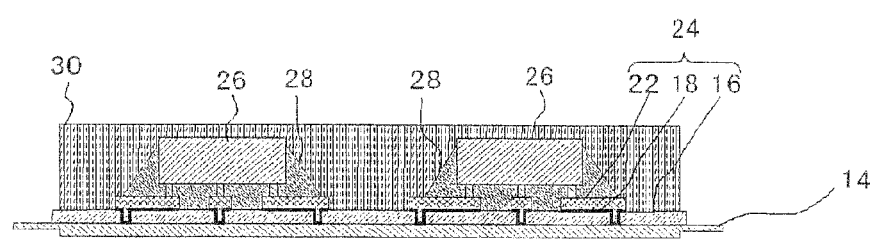

A method for manufacturing the semiconductor device according to second embodiment-(1) includes the following process operations:

(i) forming a protective film with a metal that is different from the metal composing the seed metal layer 14 so as to cover a circumference portion 12a of the support substrate 12, and then forming the seed metal layer 14 that is in contact with an end portion of the protective film, and subsequently forming the interconnect films 22 by growing a plated material from the surface of the seed metal layer 14 (FIG. 1A to FIG. 7G);

(ii) mounting semiconductor chips 26 on the interconnect films 22 (FIG. 7H to FIG. 7I);

(iii) forming a region where the support substrate 12 and the seed metal layer 14 are exposed by removing at least a portion of the protective film (FIG. 8J); and (iv) stripping the support substrate 12 from a starting point of the above-described region to remove thereof from the seed metal layer 14 (FIG. 8K).

Descriptions will be made as follows, along respective operations. First of all, a protective film (metallic film 32) is formed on a surface of a circumference portion 12a of a support substrate 12 (FIG. 5A and FIG. 5B).

The metallic film 32 is composed of a metal, which is different from the metal composing of the seed metal layer 14. Metals for composing the metallic film 32 may include aluminum (Al), titanium (Ti), tantalum (Ta), chromium (Cr), titanium nitride (TiN), titanium-tungsten alloy (TiW), tantalum nitride (TaN) or tantalum (IV) oxide ($TaO_2$). Since these metallic materials exhibit a firm adhesion with the support substrate 12, which may be composed of single crystalline silicon, glass, quartz or the like, these metallic materials can be employed for composing the protective film that provides a protection on the interface between the support substrate 12 and the seed metal layer 14. Here, an exemplary implementation employing Al for composing the metallic film 32 will be described in the present embodiment.

Figure 5A:
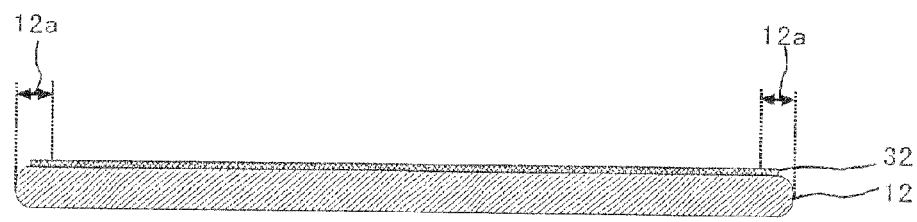
FIGS. 5A to 5C are cross-sectional views of a semiconductor device, illustrating a process for manufacturing the semiconductor device according to second embodiment-(1)
Figure 5B:

More specifically, the metallic film 32 is first formed on the entire surface of the support substrate 12 via a CVD process, sputter process or the like (FIG. 5A). Subsequently, an etch process is conducted by employing a patterned resist film to form the metallic film 32, which is in contact with the surface of the support substrate 12 in the circumference portion 12a (FIG. 5B). In addition to above, the metallic film 32 may be formed only in the circumference portion 12a by employing a certain resist mask formed on the surface of the support substrate 12 in advance.

Subsequently, a seed metal layer 14 is formed so as to contact with the end portion of the metallic film 32, so that the interface between the support substrate 12 and the seed metal layer 14 would be protected (FIG. 5O). The seed metal layer 14 is formed on the support substrate 12 via a sputter process or the likes The seed metal layer 14 is formed in regions of the support substrate 12 except the circumference portion 12a thereof.

Figure 5C:
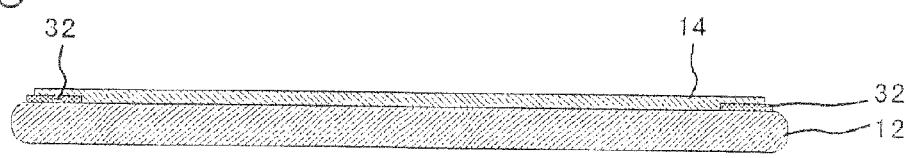

At least a portion of the seed metal layer 14 may be in contact with the metallic film 32, and more specifically, for example, a portion of the seed metal layer 14 may be formed on the top surface of the metallic film 32, as shown in FIG. 5C.

Subsequently, an insulating resin is applied on the seed metal layer 14, and then the applied insulating resin is baked to form insulating films 16 and further form interconnect films 22 on the seed metal layer 14 (FIG. 6D to FIG. 7G).

Figure 6D:
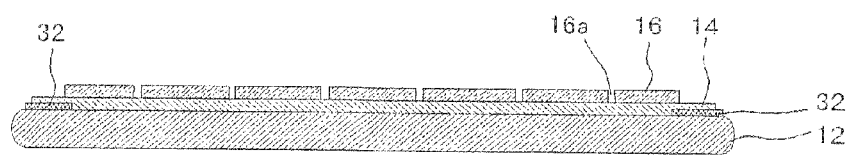
FIGS. 6D to 6F are cross-sectional views of the semiconductor device, illustrating the process for manufacturing the semiconductor device according to second embodiment-(1)

First of all, an insulating resin such as photosensitive polyimide or the like is applied so as to cover the seed metal layer 14 and contact with the metallic film 32, and thereafter an exposure and a development processes are conducted via a predetermined pattern to form via holes 16a in predetermined locations of the insulating resin. Further, the insulating resin is baked to form the insulating films 16, which cover the top surface of the seed metal layer 14 and has via holes 16a in predetermined locations (FIG. 6D). The baking temperature may be selected to be within a range of, for example, from about 300 degree C. to about 400 degree C. This facilitates a stripping of the interface between the support substrate 12 and the seed metal layer 14.

Figure 6E:
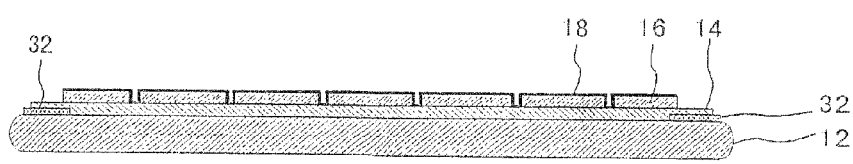

Then, an electrolytic plating process, for example, is conducted to form plated Cu and Ni in the interior of the via holes 16a, so that a plated film (not shown) is formed on the bottom of each of the via holes 16a. Further, a seed sputter film 18 is formed on the surface of the insulating film 16 to cover the interior walls of the via holes 16a (FIG. 6E). The seed sputter film 18 is formed of, for example, Ti/Cu.

After the seed sputter film 18 is formed, a resist film (not shown) having a predetermined pattern is formed, so as cover the surfaces of the seed metal layer 14, the insulating films 16 and the seed sputter film 18 and to cover the circumference portions 12a.

Subsequently, the via holes 16a are filled, and the pattern formed in the resist film 20 is also filled to form the interconnect films 22. The formation of the interconnect films 22 may be conducted by, for example, an electrolytic plating process utilizing the seed metal layer 14 as an electrically feeding layer.

Figure 6F:
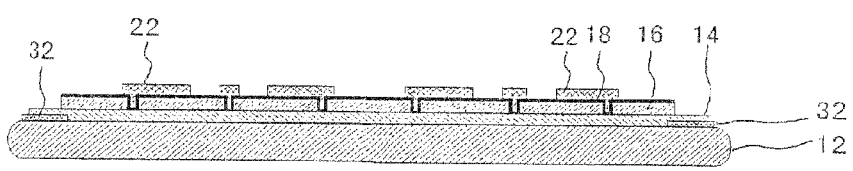

Then, the resist film having the predetermined pattern is removed to form the interconnect films 22 on the surface of the seed sputter film 18 (FIG. 6F).

Subsequently, an etchback process for the seed sputter film 18 on the surface of the insulating film 16 is conducted (FIG. 7G). Having such procedure, the interconnect layer 24 composed of the insulating film 16, the seed sputter film 18 and the interconnect film 22 is formed. The etchback process may be conducted via a wet etch process employing an etchant solution such as, for example, hydrogen fluoride (HF), a liquid mixture of sulfuric acid and hydrogen peroxide, and the like.

Since the protective film (resist film 20), which is in contact with the circumference portion 12*a* and covers the end of the seed metal layer 14 in this case, a protection for the interface between the support substrate 12 and the seed metal layer 14 can be provided, thereby preventing these members from being peeled off.

In addition to above, when the metallic film 32 is composed of Ti, TiW or the like, a developing exposure process is conducted once again so as to leave circumference portions of the resist film (not shown), such that a protective film composed of a resist film would be further formed, which is in contact with the circumference portion of the support substrate 12 and covers end portions of the metallic film 32 and the seed metal layer 14. Further, after the resist film having the interconnect pattern formed therein is completely removed, a resist film is formed and a developing exposure process is conducted once again, such that a protective film composed of a resist film (not shown) would also be formed, which covers the end portions of the metallic film 32 and the seed metal layer 14 and is in contact with the end portion of the seed metal layer 14.

More specifically, when the metallic film 32 is formed by Ti, TiW or the like, the resist film is required for providing a protection for the metallic film 32 from an etchant solution during the etch process for a seed (Ti/Cu) formed on the surface of the insulating film 16.

Then, the semiconductor chips 26 are mounted on the interconnect films 22 (FIG. 7H to FIG. 7I).

First, electrodes 27 of the semiconductor chips 26 are connected to the interconnect films 22 (FIG. 7H). Subsequently, spacings between the semiconductor chips 26 and the interconnect layers 24 are filled with the underfill resin 28 (FIG. 3H). Further, the device is encapsulated with an encapsulating resin 30 so as to cover these semiconductor chips 26, thereby providing the semiconductor chips 26 mounted on the interconnect layers 22 (FIG. 7I). In this case, the encapsulating process is carried out with an encapsulating resin 30 such as an epoxy resin and the like, so that the metallic film 32 formed in the circumference portion 12*a* of the support substrate 12 would be exposed.

Next, at least a portion of the protective film (metallic film 32) is removed to form a region where the support substrate 12 and the seed metal layer 14 are exposed (FIG. 8J).

More specifically, the metallic film 32 is removed by employing an etchant solution to expose the ends of the seed metal layer 14. Since the metallic film 32 is formed of a metal (Ti, Al and the like), which is different from a metal composing the seed metal layer 14, the etchant solution for the metallic film 32 have substantially no influence on the seed metal layer 14. Therefore, an etching of the seed metal layer 14 and an erosion of the interconnect film 22 is avoided. Typical etchant solution for the Ti thin film may include a liquid mixture of ammonia and hydrogen peroxide or the like.

Subsequently, the support substrate 12 is stripped off from the seed metal layer 14 from the above-described region as a starting point (FIG. 8K).

More specifically, the stripping can be achieved by a stress from the exposed end portion of the seed metal layer 14 as a starting point. Alternatively, a stripping starting point is prepared in the exposed end portion of the seed metal layer 14, and the support substrate 12 can be stripped from the seed metal layer 14 by a stress from the starting point.

The stripping starting point may be prepared by removing the circumference end portion of the seed metal layer 14 via a wet etch process with an etchant solution of a liquid mixture of sulfuric acid and hydrogen peroxide. Alternatively, a mechanical-cutting, a laser-irradiation, a tape-peeling or the like may also be employed for forming the stripping starting point.

The stripping process of the support substrate 12 from the seed metal layer 14 can be achieved by utilizing a stress, or alternatively, the stripping of the support substrate 12 from the seed metal layer 14 can also be achieved by utilizing a stripping solution. The stripping solutions available in this case include water and a stripping solution exhibiting an electrical conductivity. By employing a stripping solution exhibiting an electrical conductivity, a generation of a static electricity caused during the stripping of the support substrate 12 from the seed metal layer 14 can be eliminated. Typical stripping solutions exhibiting an electrical conductivity includes carbonated water, aqueous ammonia or the like.

Then, similarly as in first embodiment, the seed metal layer 14 is removed from the stripped interconnect layer 24. After the seed metal layer 14 is removed, dicing is conducted for the spacings between the semiconductor chips 26 to obtain a plurality of structural members.

In addition to above, the portions of the seed metal layer 14 remained on the support substrate 12 may be removed with a liquid mixture of sulfuric acid and aqueous hydrogen peroxide solution or the like, so that the support substrate 12 would be reused.

Second Embodiment-(2)

Next, second embodiment-(2) will be described. In the present embodiment, descriptions will be made in reference to an enlarged view of the end portion of the support substrate 12.

Figure 29A:
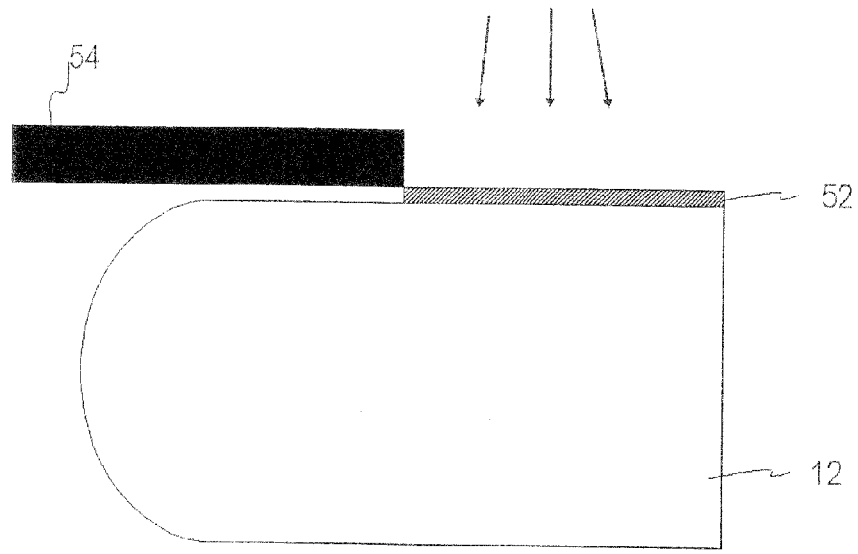
FIGS. 29A and 29B are cross-sectional views of a semiconductor device, illustrating a process for manufacturing the semiconductor device according to second embodiment-(2)
Figure 29B:
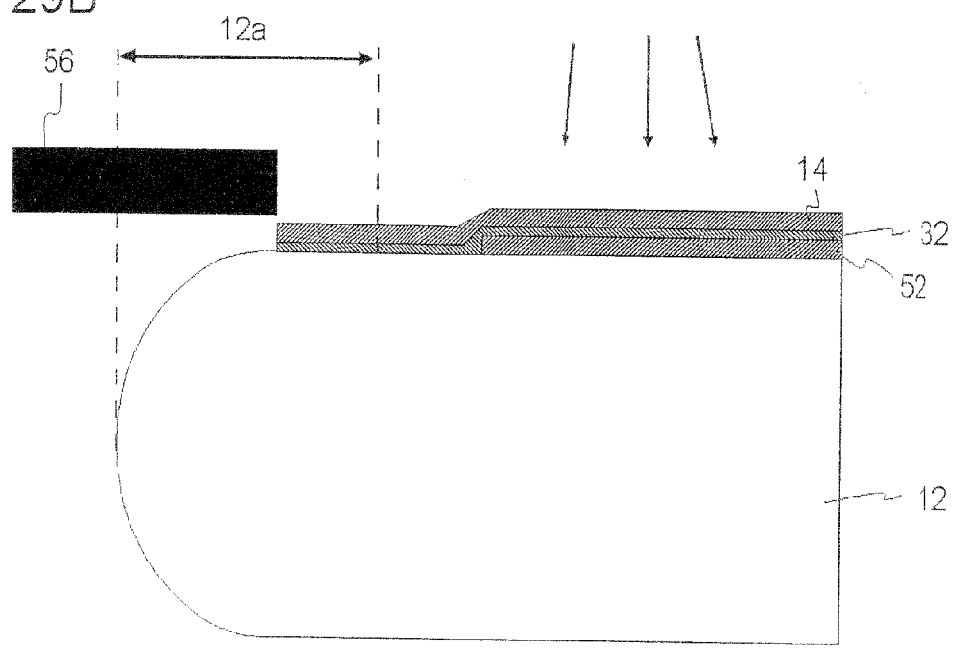

A method for manufacturing the semiconductor device according to second embodiment-(2) includes the following process operations:

(i) forming a protective film (metallic film 32) with a metal that is different from the metal composing the seed metal layer 14 so as to cover a circumference portion 12*a* of the support substrate 12, and forming a stripping film 52 that is in contact with the metallic film 32 in the end portion thereof (FIG. 29A and FIG. 29B);

(ii) forming the seed metal layer 14 on top surfaces of the metallic film 32 and the stripping film 52 so as to expose the circumference end portion of the metallic film 32, and then growing a plated material from a surface of the seed metal layer 14 to form interconnect films 22 (FIG. 29B to FIG. 30D);

(iii) mounting semiconductor chips 26 on the interconnect films 22;

(iv) forming a region where the support substrate 12 and the stripping film 52 are exposed by removing at least a portion of the metallic film 32; and (v) stripping the support substrate 12 off from a starting point of the above-described region to remove thereof from the stripping film 52.

Descriptions will be made as follows, along respective operations. First of all, the stripping film 52 is formed on the surface of the support substrate 12 except circumference portions 12a thereof (FIG. 29A).

The stripping film 52 contains copper (II) oxide (CuO), copper (I) oxide (Cu$_2$O), copper nitride (CuN), titanium dioxide (TiO$_2$) or copper (Cu). An adhesive force of the stripping film 52 containing such metallic materials with the support substrate 12 is lower, as compared with that of the seed metal layer 14. Therefore, a stripping removal of the support substrate 12 as discussed later can be facilitated by forming the stripping film 52 on the surface of the support substrate 12. In addition to above, SiO$_2$ may be contained in the outer layer of the support substrate 12.

More specifically, the stripping film 52 is formed in regions of the support substrate 12 except the circumference portion 12a thereof via a CVD process or a sputter process. In the present embodiment, as shown in FIG. 29A, the region including the circumference region 12a of the support substrate 12 is covered with a shadow ring 54, and then the stripping film 52 is formed via a sputter process. The shadow ring 54 is provided so as to prevent the stripping film 52 from being formed in the circumference region that is internal by about 3 mm from the end portion of the support substrate 12.

Then, the metallic film 32 is formed with a metal that is different from the metal composing the seed metal layer 14 so as to cover a circumference portion 12a of the support substrate 12 (FIG. 29B).

The metallic film 32 is composed of a metal, which is different from the metal composing of the seed metal layer 14.

Metals for composing the metallic film 32 may include Al, Ta, Cr, Tilt, TiW, TaN, TaO$_2$ or the like, similarly as in the above-described embodiment. Since these metallic materials exhibit a firm adhesion with the support substrate 12, which may be composed of single crystalline silicon, glass, quartz or the like, these metallic materials can be employed for composing the protective film that provides a protection on the interface between the support substrate 12 and the stripping film 52. Here, an exemplary implementation employing Al for composing the metallic film 32 will be described in the present embodiment.

More specifically, the metallic film 32 is formed in predetermined region of the support substrate 12 via a CVD process, sputter process or the like to provide a protection for the interface between the stripping film 52 and the support substrate 12. Therefore, it may be sufficient if the metallic film 32 is in contact with the end portion of the stripping film 52. In the present embodiment, as shown in FIG. 29B, a portion of the circumference region 12a of the support substrate 12 is covered with the shadow ring 56, and the metallic film 32 is formed on the top surfaces of the support substrate 12 and the stripping film 52 via a sputter process. The shadow ring 56 is provided so as to prevent the metallic film 32 from being formed in the circumference region that is internal by about 2 mm from the end portion of the support substrate 12. Further, the seed metal layer 14 is formed on the metallic film 32 via a sputter process employing the shadow ring 56. In addition to above, the seed metal layer 14 may be formed on the support substrate 12.

By forming the metallic film 32 on the top surface of the stripping film 52 in this way, it can prevent moisture and/or volatile matter generated in a baking process for polyimide resin as discussed later from reaching the stripping layer. Consequently, an improved flexibility in selecting resins for composing the insulating film 16 can be provided, and therefore, for example, an use of an epoxy resin does not adversely affect the stripped-ability of the stripping film 52.

Figure 30C:
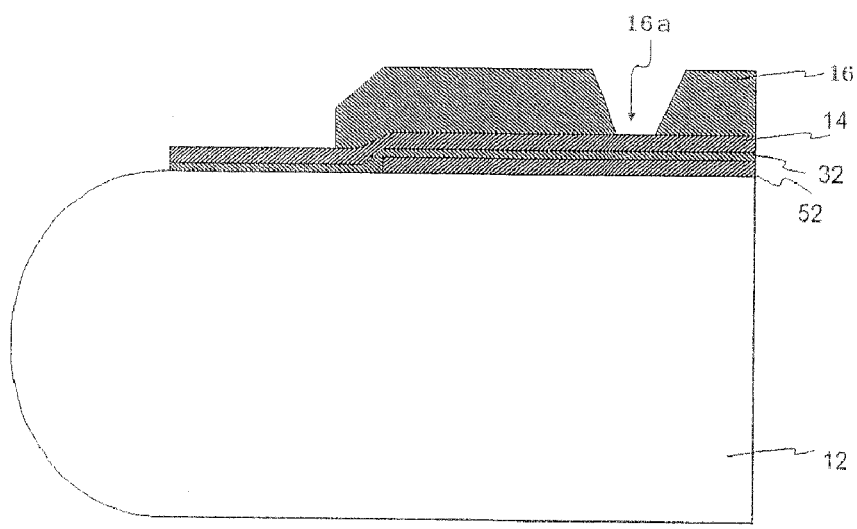
FIGS. 30C and 30D are cross-sectional views of the semiconductor device, illustrating the process for manufacturing the semiconductor device according to second embodiment-(2)

Subsequently, an insulating resin is applied on the seed metal layer 14, and then the applied insulating resin is baked to form insulating films 16. Further, via holes 16a are formed in predetermined locations of the insulating resin (FIG. 30C).

First of all, an insulating resin such as photosensitive polyimide or the like is applied so as to cover the seed metal layer 14 and contact with the metallic film 32, and thereafter an exposure and a development processes are conducted via a predetermined pattern to form via holes 16a in predetermined locations of the insulating resin. Further, the insulating resin is baked to form the insulating films 16, which covers the top surface of the seed metal layer 14 and has via holes 16a in predetermined locations (FIG. 30C). The baking temperature may be selected to be within a range of, for example, from about 300 degree C. to about 400 degree C.

Figure 30D:
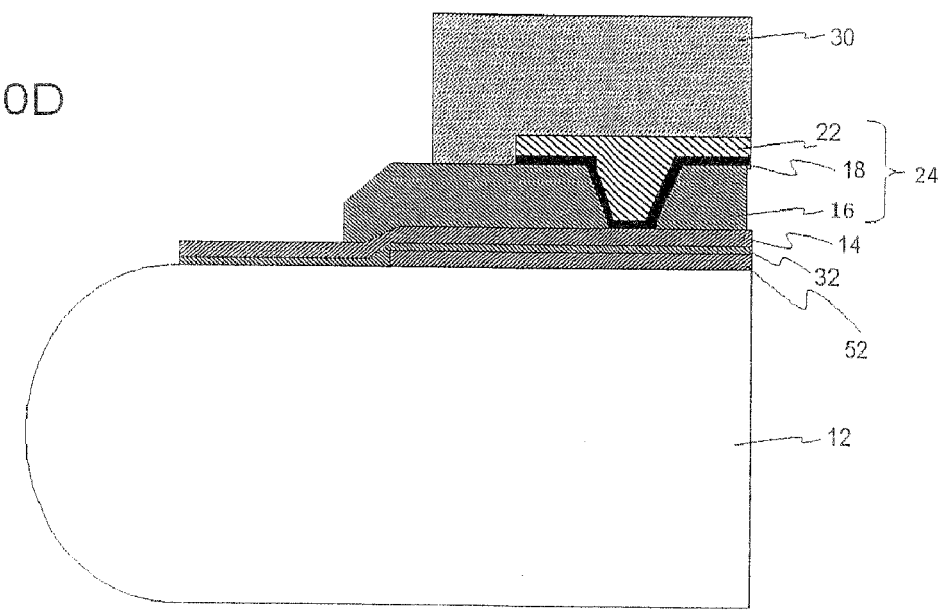

Thereafter, similarly as in second embodiment-(1), the seed sputter film 18 and the interconnect film 22 are formed, and then, the semiconductor chips 26 are mounted on the interconnect film 22. Further, spacings between the semiconductor chips 26 and the interconnect layers 24 are filled with the underfill resin 28, and then, the device is encapsulated with an encapsulating resin 30 so as to cover these semiconductor chips 26, thereby providing the semiconductor chips 26 mounted on the interconnect layers 22 (FIG. 30D). In this case, the encapsulating process is carried out with an encapsulating resin 30 such as an epoxy resin and the like, so that the metallic film 32 formed in the circumference portion 12a of the support substrate 12 would be exposed. The encapsulating process is carried out so as to avoid covering the circumference region within at least 4 mm from the end portion of the support substrate In addition to above, the multiple-layered portion of the stripping film 52 and the metallic film 32 formed on the support substrate 12 may be etched off before the encapsulating process.

Further, similarly as in second embodiment-(1), the support substrate 12 is stripped off from the stripping film 52, and further, the stripping film 52 is removed via a certain method. Typical method for removing the stripping film 52 includes an etch process with dilute sulfuric acid, an etch process with liquid mixture of sulfuric acid and hydrogen peroxide and an etch process with hydrofluoric acid. Then, a dicing process is conducted for the spacings between the semiconductor chips 26 to obtain a plurality of structural members.

Advantageous effects obtainable by employing the configuration of second embodiment will be described as follows.

In a method for manufacturing the semiconductor device of the second embodiment, an advantageous effect same as the first embodiment is obtained, and further, an advantageous effect of avoiding an erosion of the interconnect film 22 by the etchant solution can be obtained.

More specifically, the metallic film 32 is formed a metal, which is different from the metal composing the seed metal layer 14. Therefore, only the metallic film 32 can be removed with the etchant solution when a stripping starting point is provided in the seed metal layer 14, such that any influence on the seed metal layer 14 would be avoided. This provides a uniform layer thickness of the seed metal layer 14, so that only the seed metal layer 14 could be etched, thereby avoiding an erosion of the interconnect film 22.

Third Embodiment

Third embodiment will be represented by third embodiment-(1) to third embodiment-(3) as follows. First of all, third embodiment-(1) will be described.

Third Embodiment-(1)

Figure 11H:
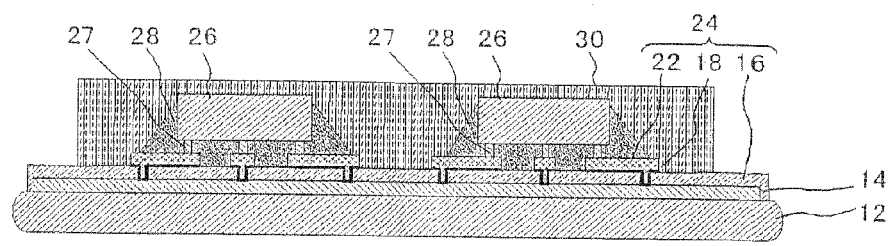
Figure 12I:
FIGS. 12I to 12K are cross-sectional views of the semiconductor device, illustrating a process for cleaning a support substrate according to third embodiment-(1)

A method for manufacturing the semiconductor device according to third embodiment-(1) includes the following process operations:

(i) forming the seed metal layer 14 formed on the support substrate 12 and forming a protective film (insulating film 16), which covers the seed metal layer 14 and is in contact with the surface of the support substrate 12; the protective film (insulating film 16) being formed so as to contact with the end portion of the interface between the support substrate 12 and the seed metal layer 14, and then, forming the interconnect films 22 by growing a plated material from the surface of the seed metal layer 14 that is exposed to a bottom of an aperture (FIG. 9A to FIG. 10E);

(ii) mounting semiconductor chips 26 on the interconnect films 22 (FIG. 10F to FIG. 11H);

(iii) forming a region where the support substrate 12 and the seed metal layer 14 are exposed by removing at least a portion of the protective film (FIG. 11H and FIG. 12I); and (iv) stripping the support substrate 12 from a starting point of the above-described region to remove thereof from the seed metal layer 14 (FIG. 12I).

Figure 9A:
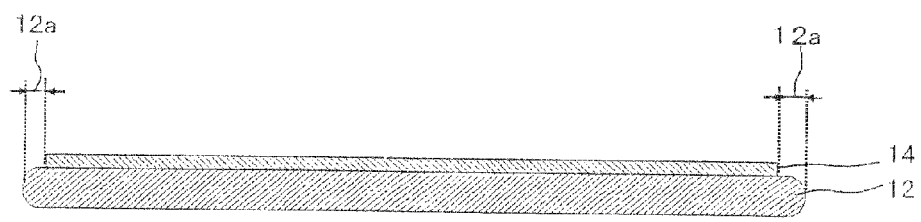
FIGS. 9A to 9C are cross-sectional views of a semiconductor device, illustrating a process for manufacturing the semiconductor device according to third embodiment-(1)

Descriptions will be made as follows, along respective operations. First of all, a seed metal layer 14 is formed on a surface of a support substrate 12 except circumference portions 12a thereof (FIG. 9A). The seed metal layer 14 is formed on the support substrate 12 via sputter process or the like.

The seed metal layer 14 may be formed of Cu, Cu alloy or the like. The seed metal layer 14 is formed in regions except the circumference portions 12a of the support substrate 12.

Figure 9B:
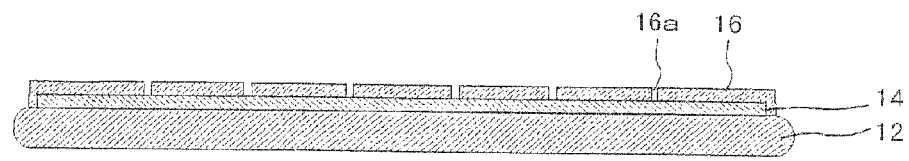

Then, the protective film (insulating film 16), which covers the seed metal layer 14 and the circumference portion 12a to provide a protection for the end portion of the interface between the support substrate 12 and the seed metal layer 14 can be provided (FIG. 9B).

An insulating resin such as photosensitive polyimide or the like is applied so as to cover the seed metal layer 14 and the circumference portions 12a, and thereafter an exposure and a development processes are conducted to form a predetermined pattern. Further, the insulating resin is baked to form the insulating films 16, which cover the seed metal layer 14 and the circumference portions 12a and has via holes 16a in predetermined locations (FIG. 9B). The baking temperature may be selected to be within a range of, for example, from about 300 degree C. to about 400 degree C. This facilitates a stripping of the interface between the support substrate 12 and the seed metal layer 14.

In the present embodiment, the insulating film 16 functions as a protective film for protecting the interface between the support substrate 12 and the seed metal layer 14. As such, when the insulating film 16 is employed as the protective film, the interface between the support substrate 12 and the seed metal layer 14 can be protected with a simple and easy method, without a need for employing additional process operations for preparing an additional protective film.

Figure 9C:
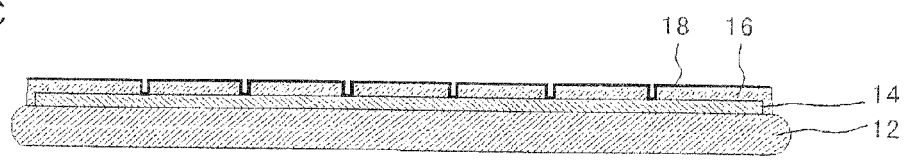

Subsequently, an electrolytic plating, for example, is conducted to plate copper (Cu) and nickel (Ni) in interiors of the via holes 16a, thereby forming plated films (not shown) in bottoms of the via holes 16a. Further, a seed sputter film 18 is formed on the surface of insulating film 16 so as to cover interior walls of the via holes 16a (FIG. 9C). Further, a resist film (not shown) having a predetermined pattern is formed on the surface of the seed sputter film 18.

Figure 10D:
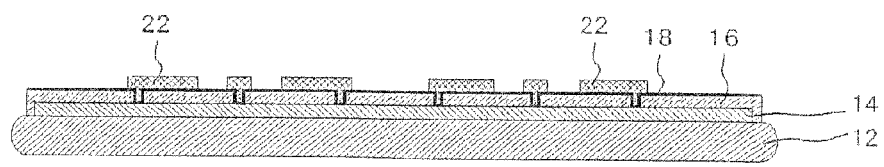
FIGS. 10D to 10F are cross-sectional views of the semiconductor device, illustrating the process for manufacturing the semiconductor device according to third embodiment-(1)

Thereafter, the via holes 16a are filled, and the pattern formed in the resist film is also filled to form the interconnect films 22 (FIG. 10D). The formation of the interconnect films 22 may be conducted by, for example, an electrolytic plating process utilizing the seed metal layer 14 as an electrically feeding layer. Further, the resist film (not shown) is removed.

Figure 10E:
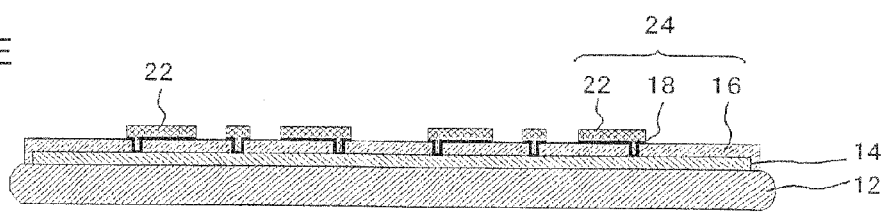

Subsequently, an etchback process for the seed sputter film 18 on the surface of the insulating film 16 is conducted (FIG. 10E). Having such procedure, the interconnect layer 24 composed of the insulating film 16, the seed sputter film 18 and the interconnect film 22 is formed. The etchback process may be conducted via a wet etch process employing an etchant solution such as, for example, hydrogen fluoride (HF), a liquid mixture of sulfuric acid and hydrogen peroxide, and the like. Since the protective film (insulating film 16), which is in contact with the circumference portion 12a and covers the end of the seed metal layer 14 in this case, a protection for the interface between the support substrate 12 and the seed metal layer 14 can be provided, thereby preventing these members from being peeled off.

Then, the semiconductor chips 26 are mounted on the interconnect films 22 (FIG. 10F to FIG. 11H).

Figure 10F:
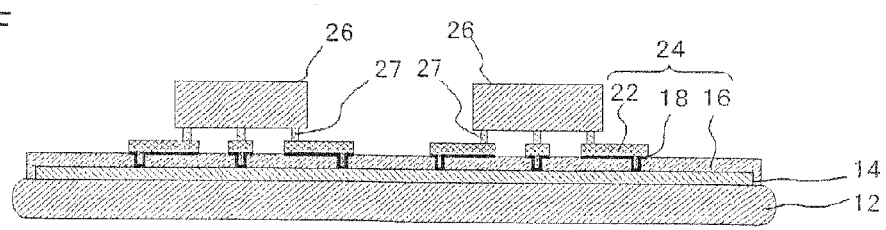
Figure 11G:
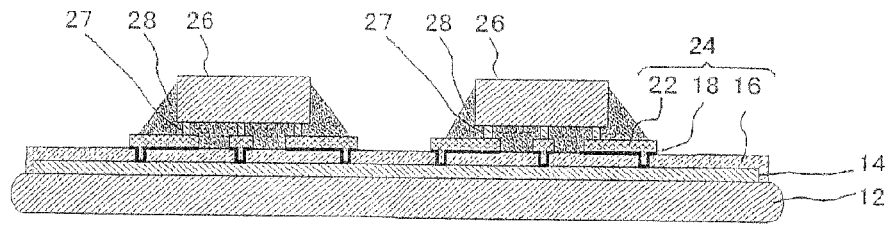
FIGS. 11G and 11H are cross-sectional views of the semiconductor device, illustrating the process for manufacturing the semiconductor device according to third embodiment-(1)

First, electrodes 27 of the semiconductor chips 26 are connected to the interconnect films 22 (FIG. 10F). Subsequently, spacings between the semiconductor chips 26 and the interconnect layers 24 are filled with the underfill resin 28 (FIG. 11G). Further, the device is encapsulated with an encapsulating resin 30 so as to cover these semiconductor chips 26, thereby providing the semiconductor chips 26 mounted on the interconnect layers 22 (FIG. 11H). In this case, the encapsulating process is carried out with an encapsulating resin 30 such as an epoxy resin and the like, so that portions of a multiple-layered structure composed of the seed metal layer 14 and the insulating film 16 would be exposed.

Next, at least a portion of the protective film (insulating film 16) is removed to form a region where the support substrate 12 and the seed metal layer 14 are exposed.

More specifically, a slit is formed in the exposed end portion of the insulating film 16 via a mechanical Processing or a laser irradiation to provide exposed portions of the interface between the support substrate 12 and the seed metal layer 14. Such slit serves as a stripping starting point.

Subsequently, the support substrate 12 is stripped off from the seed metal layer 14 from the above-described region (slit) as a starting point (FIG. 11H to FIG. 12I).

More specifically, the support substrate 12 can be stripped from the seed metal layer 14 from a starting point of a portion of the interface between the support substrate 12 and the seed metal layer 14, which is exposed by forming the slit.

The stripping process may be conducted by utilizing a stress to cause a stripping from a stripping starting point formed in the end portion of the seed metal layer 14, or may alternatively be conducted by utilizing a stripping solution to cause a stripping from the stripping starting point. The stripping solution available in the present embodiment may include a solution exhibiting an electrical conductivity, and such type of solution may be employed to eliminate static electricity, which is generated when the support substrate 12 is stripped from the seed metal layer 14. Typical stripping solutions exhibiting an electrical conductivity includes carbonated water, aqueous ammonia or the like.

Then, the seed metal layer 14 is removed from the stripped interconnect layer 24 via an etch process. After the seed metal layer 14 is removed, dicing is conducted for the spacings between the semiconductor chips 26 to obtain a plurality of structural members.

Figure 12J:
Figure 12K:
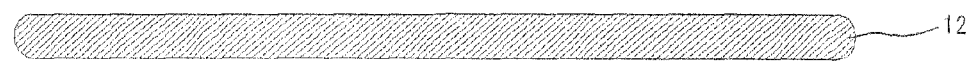

On the other hand, a multi-layered film of the seed metal layer 14 and the insulating film 16 is provided in the end portion of the stripped support substrate 12 (FIG. 12I). The seed metal layer 14 is removed from the support substrate 12 by employing nitric acid, and then cleaned (FIG. 12J). Further, the support substrate 12 is heated up to 500 degree C. within an atmosphere containing oxygen to remove the insulating film 16 (FIG. 12K). Having such procedure, the support substrate 12 can be reused. In addition to above, the seed metal layer 14 may be removed after the insulating film 16 is removed. Alternatively, when a metallic material exists on the support substrate 12, the support substrate 12 can be cleaned with an acid or the like.

Third Embodiment-(2)

Next, third embodiment-(2) will be described. In the present embodiment, descriptions will be made in reference to an enlarged view of the end portion of the support substrate 12.

Figure 17M:
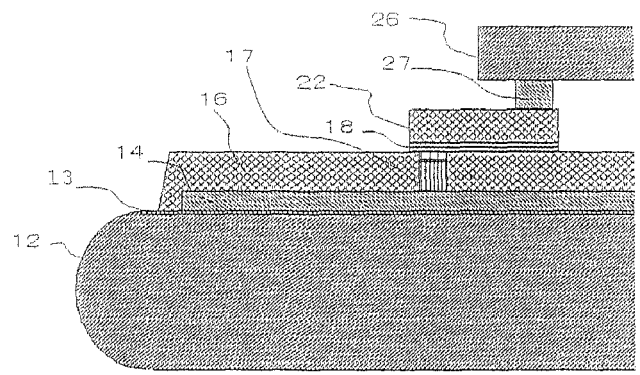
FIGS. 17M to 17O are cross-sectional views of the semiconductor device, illustrating the process for manufacturing the semiconductor device according to third embodiment-(2)
Figure 17N:
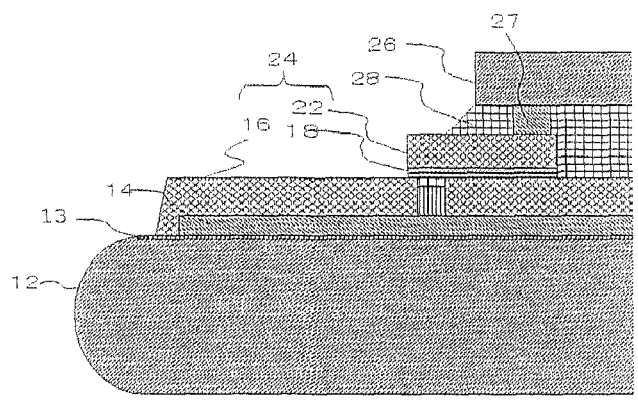
Figure 17O:
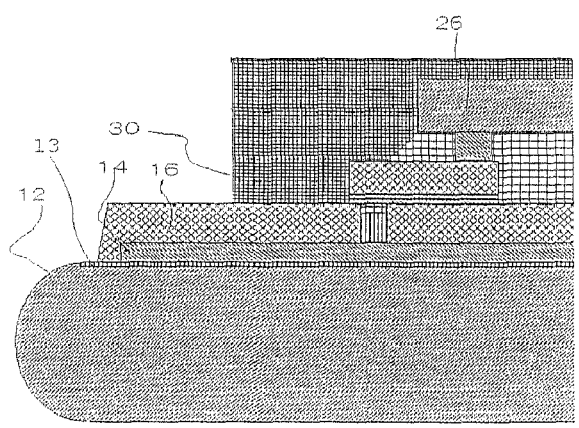
Figure 18P:
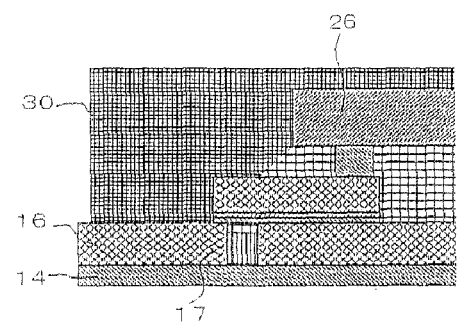
FIGS. 18P to 18R are cross-sectional views of the semiconductor device, illustrating a process for cleaning a support substrate according to third embodiment-(2)

A method for manufacturing the semiconductor device according to third embodiment-(2) includes the following process operations:

(i) forming the protective film (insulating film 16) having a plated film 17 embedded in an aperture, the plated film providing an electrical coupling to the seed metal layer 14 formed on the support substrate 12; the protective film (insulating film 16) being formed so as to cover the seed metal layer 14 and be in contact with the support substrate 12; then, forming the seed sputter film 18 on the insulating film 16, the seed sputter film 18 being electrically connected to the plated film 17; and growing a plated material from the surface of the seed sputter film 18 to form interconnect films 22 (FIG. 13A to FIG. 16I);

(ii) mounting semiconductor chips 26 on the interconnect films 22 (FIG. 17M to FIG. 17O);

(iii) forming a region where the support substrate 12 and the seed metal layer 14 are exposed by removing at least a portion of the protective film (FIG. 17O to FIG. 18I); and (iv) stripping the support substrate 12 off from a starting point of the above-described region to remove thereof from the seed metal layer 14 (FIG. 18P).

Figure 13A:
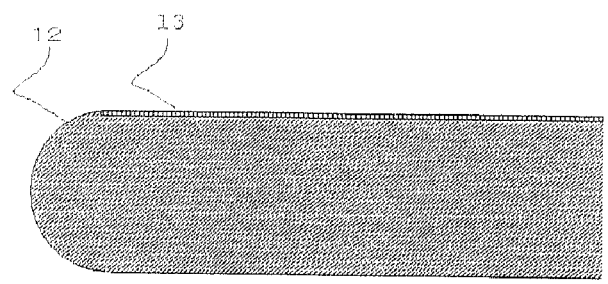
FIGS. 13A to 13C are cross-sectional views of a semiconductor device, illustrating a process for manufacturing the semiconductor device according to third embodiment-(2)

First of the support substrate 12 having an $SiO_2$ film 13 formed on the surface and serving as a stripping layer is prepared (FIG. 13A). The $SiO_2$ film 13 may be formed by a process for thermally oxidizing a silicon substrate, or by a chemical vapor deposition (CVD) process. In addition to above, similarly as in first and second embodiments, a quartz substrate, a glass substrate or the like may be employed.

Figure 13B:
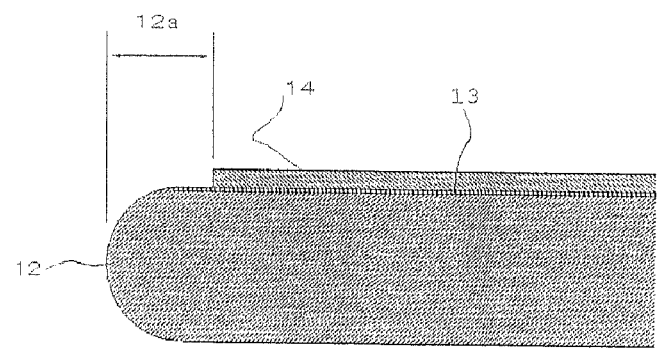

Then, the seed metal layer 14 is formed on the surface of the support substrate 12 except the circumference portions 12a thereof (FIG. 13B). The seed metal layer 14 is formed on the support substrate 12 via a sputter process or the like. The seed metal layer 14 may be formed of Cu, Cu alloy or the like. The seed metal layer 14 is formed in regions except the circumference portions 12a of the support substrate 12. The width of the circumference portion 12a may be within a range of from about 1 mm to about 3 mm. In addition, the film thickness of the seed metal layer 14 may be about 0.2 μm.

Figure 13C:
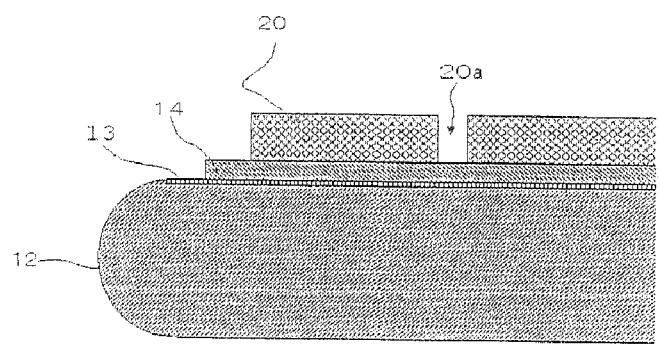

Subsequently, a photo resist is applied on the seed metal layer 14, and then dried to form the resist film. Further, a developing and an exposure processes are conducted via an ordinary processes to form the resist film 20 have an aperture 20a in a predetermined position (FIG. 13C).

Subsequently, a plated film 17 is formed so as to fill the aperture 20a of the resist film 20. The formation of the plated film 17 may be conducted by, for example, an electrolytic plating process utilizing the seed metal layer 14 as an electrically feeding layer.

Figure 14D:
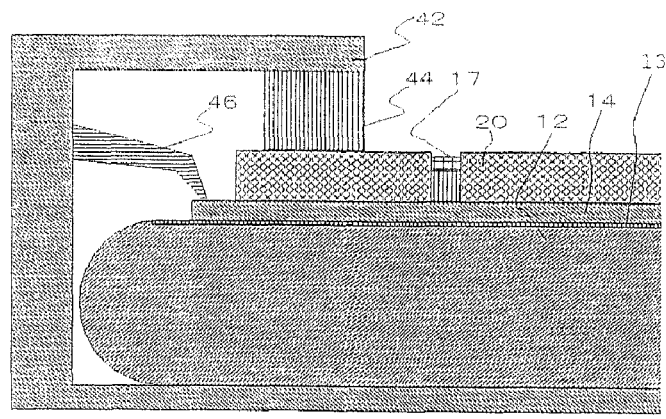
FIGS. 14D to 14F are cross-sectional views of the semiconductor device, illustrating the process for manufacturing the semiconductor device according to third embodiment-(2)

The electrolytic plating process may be conducted by the method as described in first embodiment. More specifically, as shown in FIG. 14D, the support substrate 12 is fixed onto the support jig 42. Further, the support jig 42 comprises a packing 44 and an electrode 46, and is electrically connected to the surface of the seed metal layer 14 via the electrode 46. The support substrate 12 fixed to such support jig 42 is dipped into the plating solution to carry out the electrolytic plating process utilizing the seed metal layer 14 as an electrically feeding layer, thereby forming the plated film 17 in the aperture 20a. The plated film 17 may be configured to be a dual layer structure, and may be formed by, for example, forming a copper plated film to have a thickness of about 3 μm, and then forming a nickel plated film to have a thickness of about 6 μm.

Figure 14E:
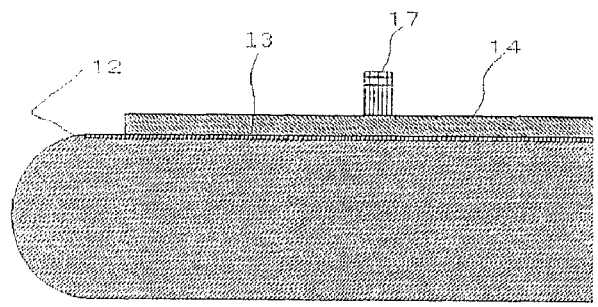

After the electrolytic plating process is conducted, the support substrate 12 is removed from the support jig 42, and the resist film 20 is removed via an ordinary method (FIG. 14E).

Figure 14F:
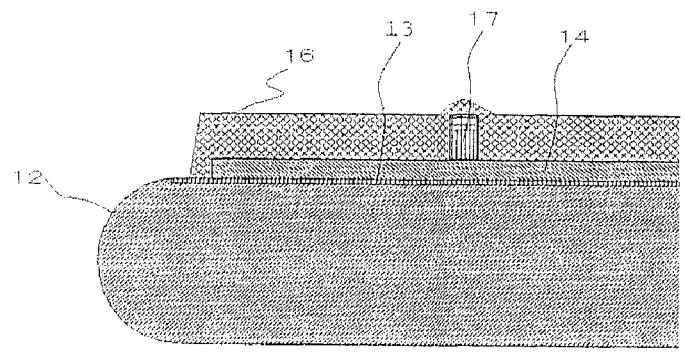

Subsequently, a protective film (insulating film 16) covering the seed metal layer 14 and the circumference portion 12a is formed to provide a protection on the end portion of the interface between the support substrate 12 and the seed metal layer 14 (FIG. 14F).

More specifically, an insulating resin such as a non-photosensitive polyimide and the like is applied to cover the seed metal layer 14, the circumference portion 12a of support substrate 12 and the plated film 17, and then, an edge rinse process is conducted. The edge rinse process results in removing the insulating resin of the end portion of the support substrate 12. Thereafter, the insulating resin is baked within a nitrogen atmosphere to form the insulating film 16 that covers the seed metal layer 14, the circumference portion 12a of the support substrate 12 and the plated film 17 (FIG. 14F). The baking temperature may be selected to be within a range of, for example, from about 300 degree C. to about 400 degree C. This facilitates a stripping of the interface between the support substrate 12 and the seed metal layer 14.

In the present embodiment, the insulating film 16 functions as a protective film for protecting the interface between the support substrate 12 and the seed metal layer 14. As such, when the insulating film 16 is employed as the protective film, the interface between the support substrate 12 and the seed metal layer 14 can be protected with a simple and easy method, without a need for employing additional process operations for preparing an additional protective film.

Figure 15G:
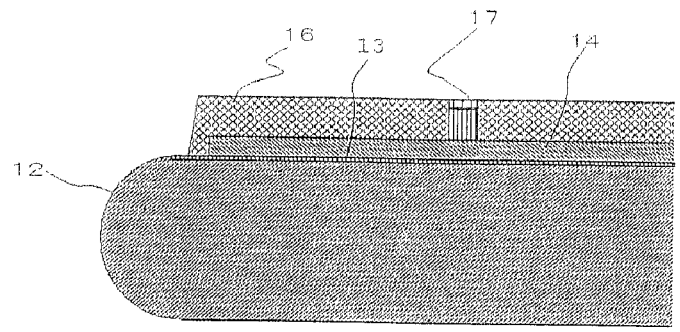
FIGS. 15G to 15I are cross-sectional views of the semiconductor device, illustrating the process for cleaning the support substrate according to third embodiment-(2)
Figure 15H:
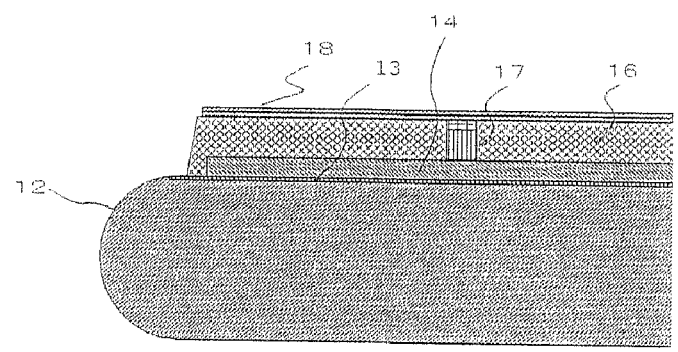

Subsequently, the surface of the insulating film 16 is planarized via a chemical mechanical polishing (CMP) or a processing with a grinding apparatus to expose the nickel film on the plated film 17, which is coplanar with the surface of insulating film 16 (FIG. 15G). Then, an oxide film formed on the surface of the nickel film of the plated film 17 is removed via an etch process employing argon (Ar) plasma to form the seed sputter film 18 that covers the insulating film 16. The seed sputter film 18 is formed by, for example, depositing a Ti film and a Cu film (FIG. 15H).

Figure 15I:
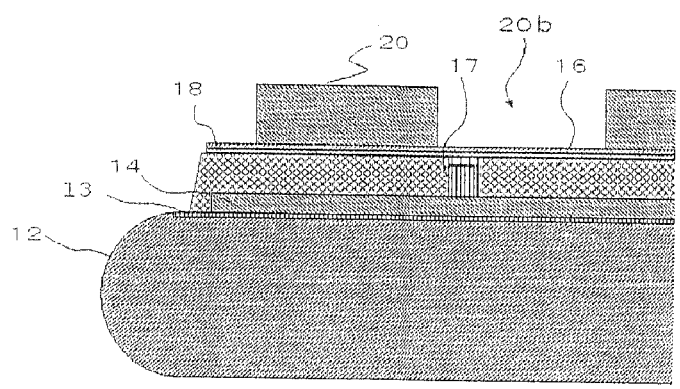

Subsequently, a photo resist is applied on the seed sputter film 18, and then dried to form the resist film. Further, a developing and an exposure processes are conducted via an ordinary processes to form the resist film 20 have an aperture 20b in a predetermined position (FIG. 15I). The plated film 17 is located under the bottom of the aperture 20b of the resist film 20.

Figure 16J:
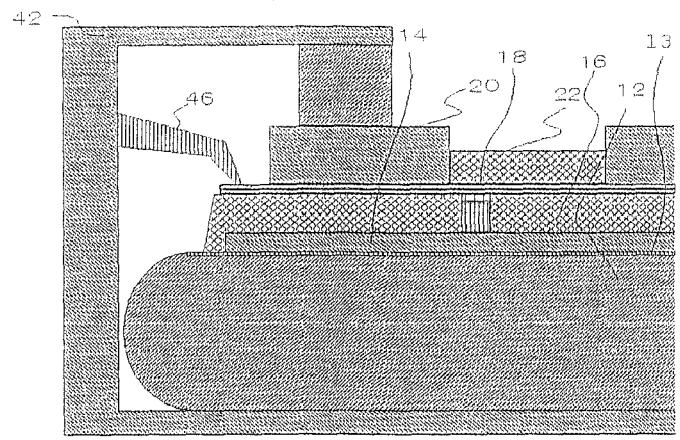
FIGS. 16J to 16L are cross-sectional views of the semiconductor device, illustrating the process for manufacturing the semiconductor device according to third embodiment-(2)

Subsequently, an interconnect film 22 is formed so as to fill the aperture 20b of the resist film 20. The formation of the interconnect film 22 may be conducted by, for example, an electrolytic plating process utilizing the seed sputter film 18 as an electrically feeding layer (FIG. 16J). The electrolytic plating process may be conducted by a method similar to that described above. The interconnect film 22 may be configured of a multiple-layered structure, and may be formed by sequentially depositing, for example, a copper plated film having a thickness of about 3 μm, a nickel plated film having a thickness of about 6 μm and a gold-plated film having a thickness of about 1 μm.

Figure 16K:
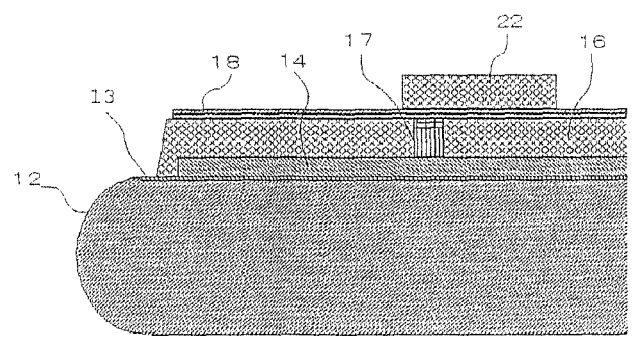
Figure 16L:
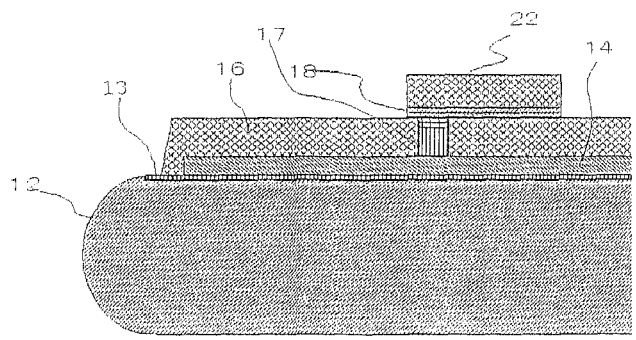

After the electrolytic plating process is conducted, the support substrate 12 is removed from the support jig 42, and the resist film 20 is removed via an ordinary method (FIG. 16K).

Subsequently, an etchback process for the seed sputter film 18 on the surface of the insulating film 16 is conducted (FIG. 16I). Having such procedure, the interconnect layer 24 composed of the insulating film 16, the seed sputter film 18 and the interconnect film 22 is formed. The etchback process may be conducted via a wet etch process employing an etchant solution such as, for example, hydrogen fluoride (HF), a liquid mixture of sulfuric acid and hydrogen peroxide, and the like. Since the protective film (insulating film 16), which is in contact with the circumference portion 12a and covers the end of the seed metal layer 14 in this case, a protection for the interface between the support substrate 12 and the seed metal layer 14 can be provided, thereby preventing these members from being peeled off.

Then, the semiconductor chips 26 are mounted on the interconnect films 22 (FIG. 17M to FIG. 17O). First, electrodes 27 of the semiconductor chips 26 are connected to the interconnect films 22 (FIG. 17M). Subsequently, spacings between the semiconductor chips 26 and the interconnect layers 24 are filled with the underfill resin 28 (FIG. 17N). Further, the device is encapsulated with an encapsulating resin 30 so as to cover these semiconductor chips 26, thereby providing the semiconductor chips 26 mounted on the interconnect layers 22 (FIG. 17O). The packaging process with the encapsulating resin 30 may be conducted via a compression molding process. Further, the encapsulating process with the encapsulating resin 30 is carried out, so that portions of a multiple-layered structure composed of the seed metal layer 14 and the insulating film 16 would be exposed.

Next, at least a portion of the protective film (insulating film 16) is removed to form a region where the support substrate 12 and the seed metal layer 14 are exposed. More specifically, a slit is formed in the exposed end portion of the insulating film 16 via a mechanical processing or a laser irradiation to provide exposed portions of the interface between the support substrate 12 and the seed metal layer 14. Such slit serves as a stripping starting point.

Subsequently, the support substrate 12 is stripped off from the seed metal layer 14 from the above-described region (slit) as a starting point (FIG. 17O to FIG. 18P). More specifically, the support substrate 12 can be stripped from the seed metal layer 14 a starting point of a portion of the interface between the support substrate 12 and the seed metal layer 14, which is exposed by forming the slit.

The stripping process may be conducted by utilizing a stress to cause a stripping from a stripping starting point formed in the end portion of the seed metal layer 14, or may alternatively be conducted by utilizing a stripping solution to cause a stripping from the stripping starting point. The stripping solution available in the present embodiment may include a solution exhibiting an electrical conductivity, and such type of solution may be employed to eliminate static electricity, which is generated when the support substrate 12 is stripped from the seed metal layer 14. Typical stripping solutions exhibiting an electrical conductivity includes carbonated water, aqueous ammonia or the like.

Figure 18Q:
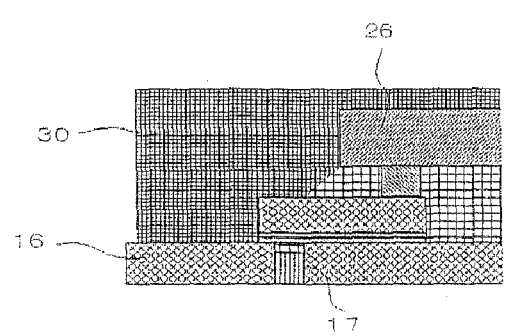
Figure 18R:
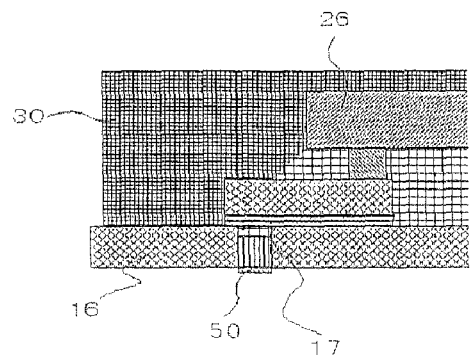

Then, the seed metal layer 14 is removed from the stripped interconnect layer 24 via an etch process (FIG. 18Q). Further, an external coupling-electrode 50 is formed on a Cu plating layer of the plated film 17 exposed to be coplanar with the lower surface of the insulating film 16 (FIG. 18R). The external coupling-electrode 50 may be formed by, for example, a substitutional electroless gold plating process.

After the external coupling-electrode 50 is formed, a dicing process is conducted for the spacings between the semiconductor chips 26 to obtain a plurality of structural members. On the other hand, the stripped support substrate 12 is treated similarly as described above (FIG. 12I to FIG. 12K).

Third Embodiment-(3)

Next, third embodiment-(3) will be described. In the present embodiment, descriptions will be made in reference to an enlarged view of the end portion of the support substrate 12.

Figure 22J:
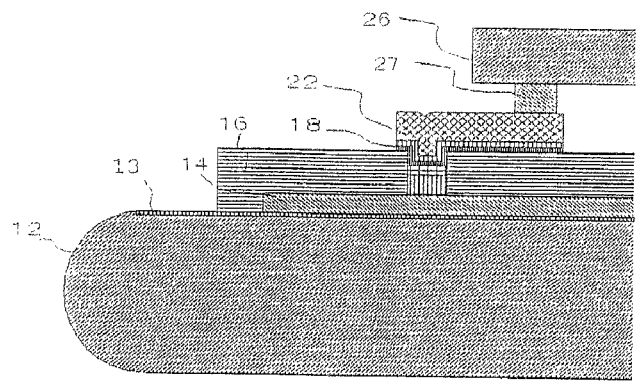
FIGS. 22J to 22L are cross-sectional views of the semiconductor device, illustrating the process for manufacturing the semiconductor device according to third embodiment-(3)
Figure 22K:
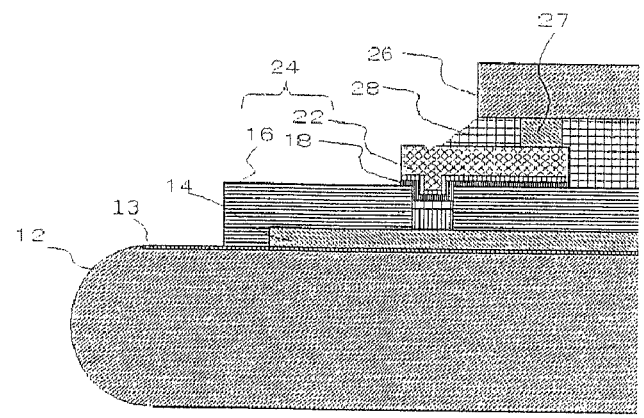
Figure 22L:
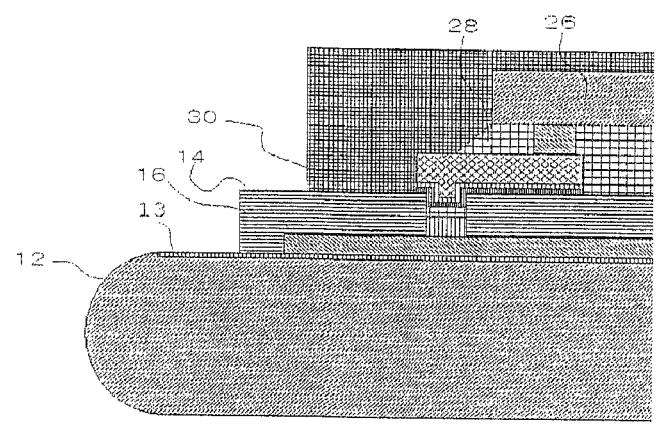
Figure 23M:
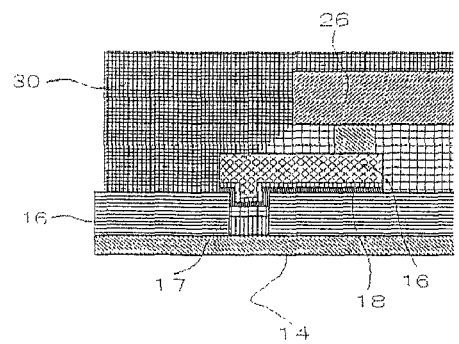
FIGS. 23M to 23O are cross-sectional views of the semiconductor device, illustrating the process for cleaning the support substrate according to third embodiment (3)

A method for manufacturing the semiconductor device according to third embodiment-(3) includes the following process operations:

(i) forming the protective film (insulating film 16) having a plated film 17 embedded in an aperture, the plated film providing an electrical coupling to the seed metal layer 14 formed on the support substrate 12; the protective film (insulating film 16) being formed so as to cover the seed metal layer 14 and be in contact with the support substrate 12; then, forming the seed sputter film 18 on the insulating film 16, the seed sputter film 18 being electrically connected to the plated film 17; and growing a plated material from the surface of the seed sputter film 18 to form interconnect films 22 (FIG. 19A to FIG. 21I);

(ii) mounting semiconductor chips 26 on the interconnect films 22 (FIG. 22J to FIG. 22L);

(iii) forming a region where the support substrate 12 and the seed metal layer 14 are exposed by removing at least a portion of the protective film (FIG. 22L to FIG. 23M); and (iv) stripping the support substrate 12 off from a starting point of the above-described region to remove thereof from the seed metal layer 14 (FIG. 23M).

Descriptions will be made as follows, along respective operations. In the present embodiment, descriptions will be made in reference to an enlarged view of the end portion of the support substrate 12.

Figure 19A:
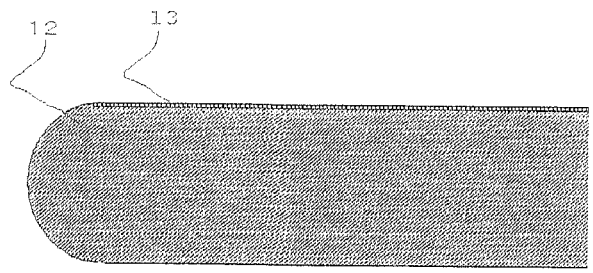
FIGS. 19A to 19C are cross-sectional views of a semiconductor device, illustrating a process for manufacturing the semiconductor device according to third embodiment-(3)

First of all, the support substrate 12 having an $SiO_2$ film 13 formed on the surface and serving as a stripping layer is prepared (FIG. 19A). The $SiO_2$ film 13 may be formed by a process for thermally oxidizing a silicon substrate, or by a CVD process. In addition to above, similarly as in first and second embodiments, a quartz substrate, a glass substrate or the like may be employed.

Figure 19B:
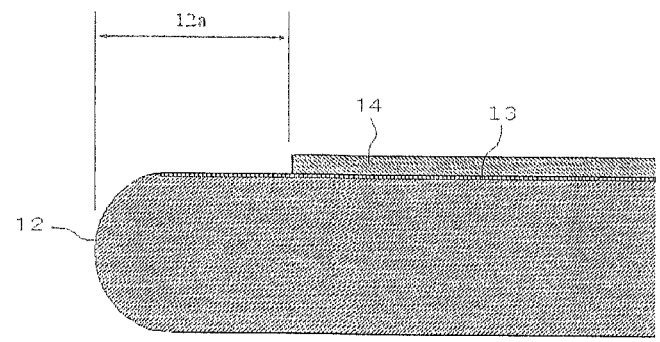

Then, the seed metal layer 14 is formed on the surface of the support substrate 12 except the circumference portions 12a thereof (FIG. 19B). The seed metal layer 14 is formed on the support substrate 12 via a sputter process or the like. The seed metal layer 14 may be formed of Cu, Cu alloy or the like. The seed metal layer 14 is formed in regions except the circumference portions 12a of the support substrate 12. The width of the circumference portion 12a may be within a range of from about 1 mm to about 3 mm. In addition, the film thickness of the seed metal layer 14 may be about 0.2 μm.

Figure 19C:
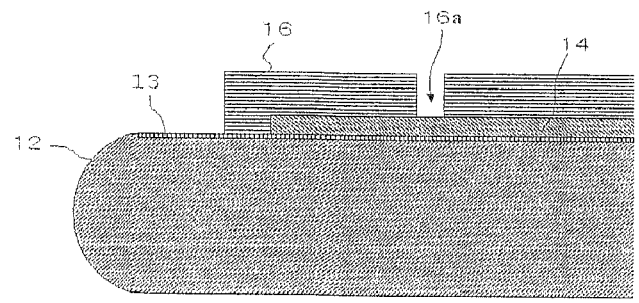

Subsequently, a protective film (insulating film 16) covering the seed metal layer 14 and the circumference portion 12a is formed to provide a protection on the end portion of the interface between the support substrate 12 and the seed metal layer 14 (FIG. 19C). More specifically, an insulating resin such as photosensitive polyimide or the like is applied so as to cover the seed metal layer 14 and the circumference portions 12a, and thereafter an exposure and a development processes are conducted to form a predetermined pattern. Further, the insulating resin is baked within a nitrogen atmosphere to form the insulating films 16, which cover the seed metal layer 14 and the circumference portions 12a and has via holes 16a in predetermined locations (FIG. 19C). The baking temperature may be selected to be within a range of, for example, from about 300 degree C. to about 400 degree C. This facilitates a stripping of the interface between the support substrate 12 and the seed metal layer 14.

In the present embodiment, the insulating film 16 functions as a protective film for protecting the interface between the support substrate 12 and the seed metal layer 14. As such, when the insulating film 16 is employed as the protective film, the interface between the support substrate 12 and the seed metal layer 14 can be protected with a simple and easy method, without a need for employing additional process operations for preparing an additional protective film.

Figure 20D:
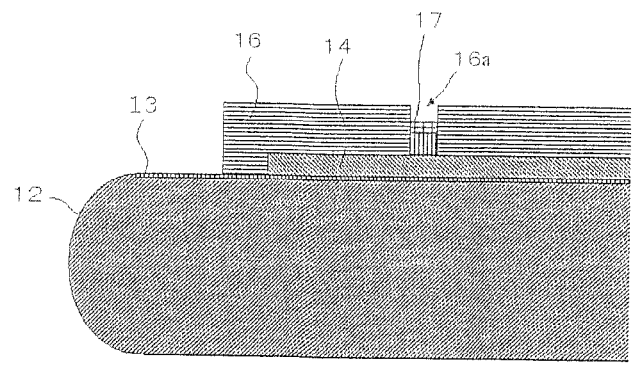
FIGS. 20D to 20F are cross-sectional views of the semiconductor device, illustrating a process for cleaning a support substrate according to third embodiment-(3)
Figure 20E:
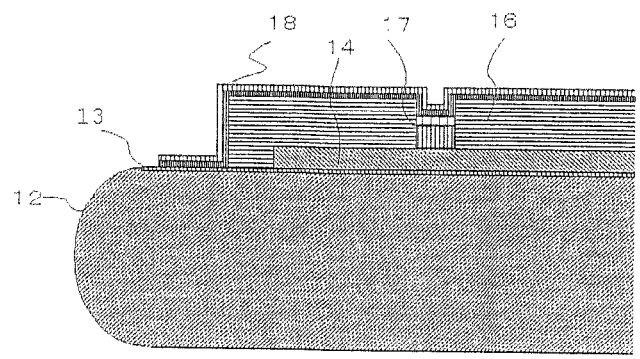

Subsequently, a plated film 17 is formed in the via hole 16a (FIG. 20D). More specifically, an electroless plating process is conducted so that Cu and Ni are sequentially plated in the interior of the via hole 16a to form the plated film 17. The film thickness of the Cu plated film may be about 3 μm, and film thickness of the Ni plated film may be about 3 μm.

Then, an oxide film formed on the surface of the nickel film exposed on the plated film 17 is removed via an etch process employing Ar plasma to form the seed sputter film 18 that covers the insulating film 16 and the support substrate 12. The seed sputter film 18 is formed by, for example, depositing a Ti film and a Cu film (FIG. 20D).

Figure 20F:
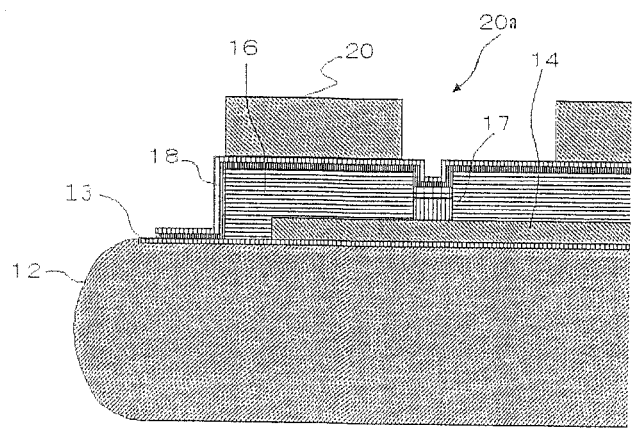

Subsequently, a photo resist is applied on the seed sputter film 18, and then dried to form the resist film. Further, a developing and an exposure processes are conducted via an ordinary processes to form the resist film 20 have an aperture 20a in a predetermined position (FIG. 20F). The plated film 17 is located under the bottom of the aperture 20a of the resist film 20.

Figure 21G:
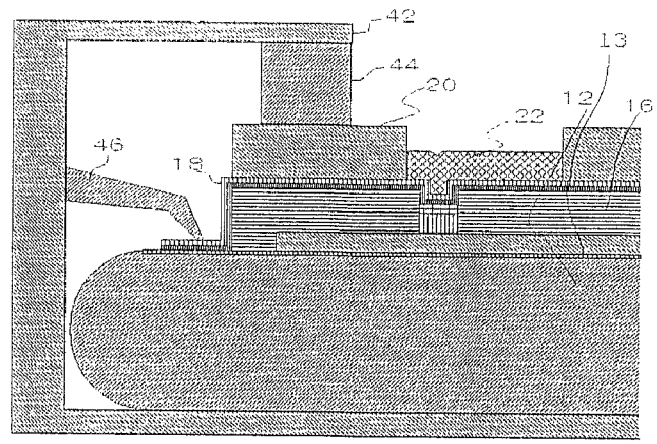
FIGS. 21G to 21I are cross-sectional views of the semiconductor device, illustrating the process for manufacturing the semiconductor device according to third embodiment-(3)

Subsequently, an interconnect film 22 is formed so as to fill the aperture 20a of the resist film 20. The formation of the interconnect film 22 may be conducted by, for example, an electrolytic plating process utilizing the seed sputter film 18 as an electrically feeding layer (FIG. 21G). The electrolytic plating process may be conducted by a method similar to that described above. The interconnect film 22 may be configured of a multiple-layered structure, and may be formed by sequentially depositing, for example, a copper plated film having a thickness of about 3 μm, a nickel plated film having a thickness of about 6 μm and a gold-plated film having a thickness of about 1 μm.

Figure 21H:
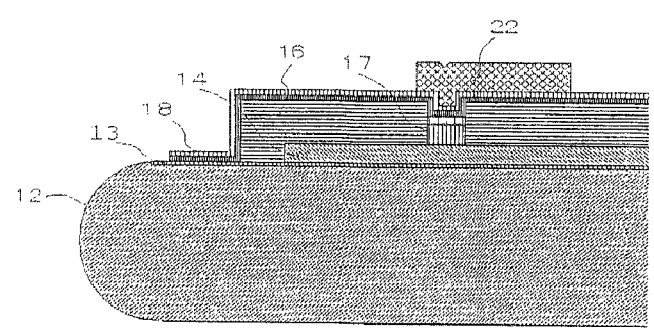

After the electrolytic plating process is conducted, the support substrate 12 is removed from the support jig 42, and the resist film 20 is removed via an ordinary method (FIG. 21H).

Figure 21I:
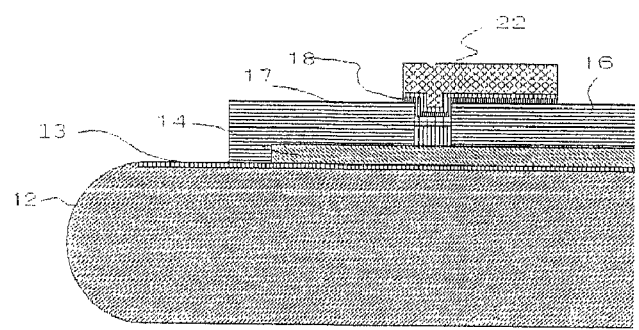

Subsequently, an etchback process for the seed sputter film 18 on the surface of the insulating film 16 is conducted (FIG. 21I). Having such procedure, the interconnect layer 24 composed of the insulating film 16, the seed sputter film 18 and the interconnect film 22 is formed. The etchback process may be conducted via a wet etch process employing an etchant solution such as, for example, hydrogen fluoride (HF), a liquid mixture of sulfuric acid and hydrogen peroxide, and the like. Since the protective film (insulating film 16), which is in contact with the circumference portion 12a and covers the end of the seed metal layer 14 in this case, a protection for the interface between the support substrate 12 and the seed metal layer 14 can be provided, thereby preventing these members from being peeled off.

Then, the semiconductor chips 26 are mounted on the interconnect films 22 (FIG. 22J to FIG. 22L). First, an electrode 27 of the semiconductor chip 26 is connected to the interconnect films 22 (FIG. 22J). Subsequently, spacings between the semiconductor chips 26 and the interconnect layers 24 are filled with the underfill resin 28 (FIG. 22K). Further, the device is encapsulated with an encapsulating resin 30 so as to cover these semiconductor chips 26, thereby providing the semiconductor chips 26 mounted on the interconnect layers 22 (FIG. 22L). The packaging process with the encapsulating resin 30 may be conducted via a compression molding process. Further, the encapsulating process with the encapsulating resin 30 is carried out, so that portions of a multiple-layered structure composed of the seed metal layer 14 and the insulating film 16 would be exposed.

Next, at least a portion of the protective film (insulating film 16) is removed to form a region where the support substrate 12 and the seed metal layer 14 are exposed. More specifically, a slit is formed in the exposed end portion of the insulating film 16 via a mechanical processing or a laser irradiation to provide exposed portions of the interface between the support substrate 12 and the seed metal layer 14. Such slit serves as a stripping starting point.

Subsequently, the support substrate 12 is stripped off from the seed metal layer 14 from the above-described region (slit) as a starting point (FIG. 22L to FIG. 23M). More specifically, the support substrate 12 can be stripped from the seed metal layer 14 a starting point of a portion of the interface between the support substrate 12 and the seed metal layer 14, which is exposed by forming the slit.

The stripping process may be conducted by utilizing a stress to cause a stripping from a stripping starting point formed in the end portion of the seed metal layer 14, or may alternatively be conducted by utilizing a stripping solution to cause a stripping from the stripping starting point. The stripping solution available in the present embodiment may include a solution exhibiting an electrical conductivity, and such type of solution may be employed to eliminate static electricity, which is generated when the support substrate 12 is stripped from the seed metal layer 14. Typical stripping solutions exhibiting an electrical conductivity includes carbonated water, aqueous ammonia or the like.

Figure 23N:
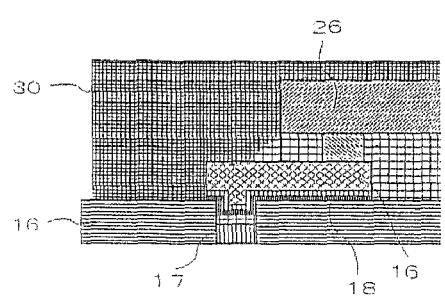
Figure 23O:
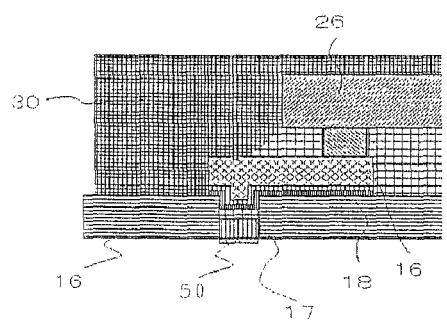
Figure 24A:
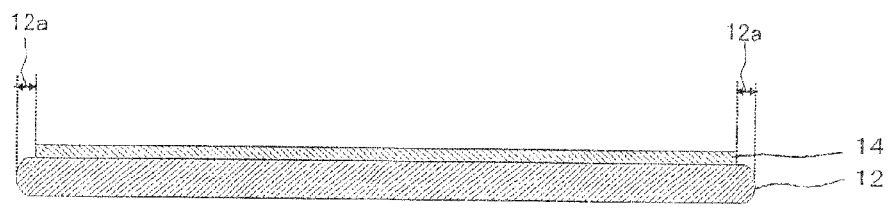
FIGS. 24A to 24C are cross-sectional views of a semiconductor device, illustrating a process for manufacturing the semiconductor device according to other embodiment.
Figure 24B:
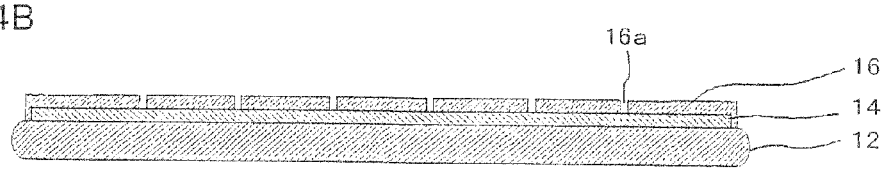
Figure 24C:
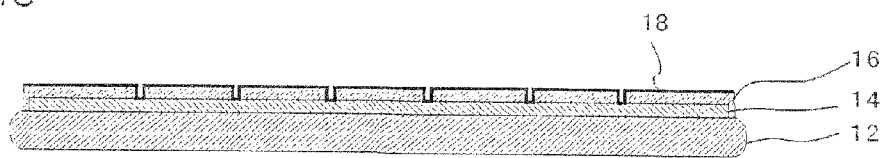
Figure 25D:
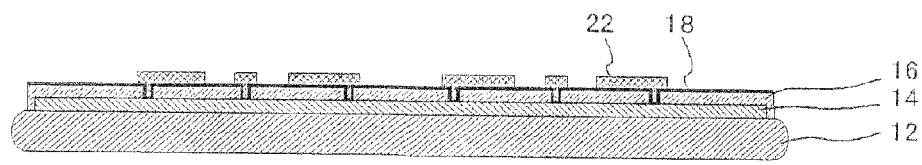
FIGS. 25D to 25F are cross-sectional views of the semiconductor device, illustrating the process for manufacturing the semiconductor device according to other embodiment.
Figure 25E:
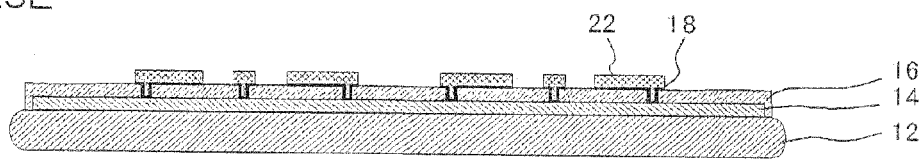
Figure 25F:
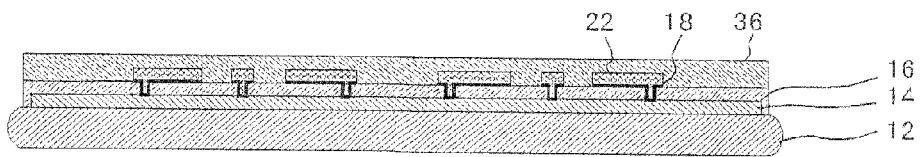
Figure 26G:
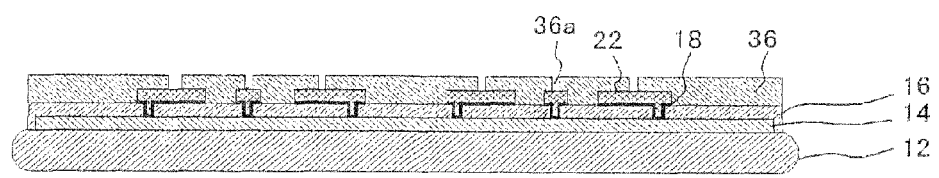
FIGS. 26G to 26I are cross-sectional views of the semiconductor device, illustrating the process for manufacturing the semiconductor device according to other embodiment.
Figure 26H:
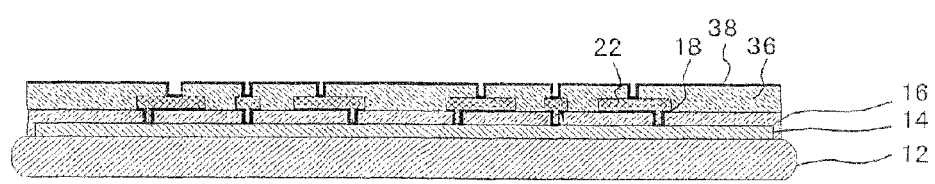
Figure 26I:
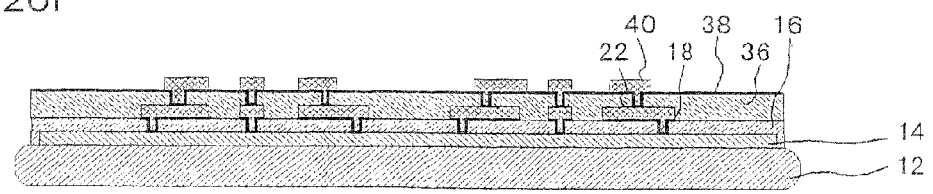
Figure 27J:
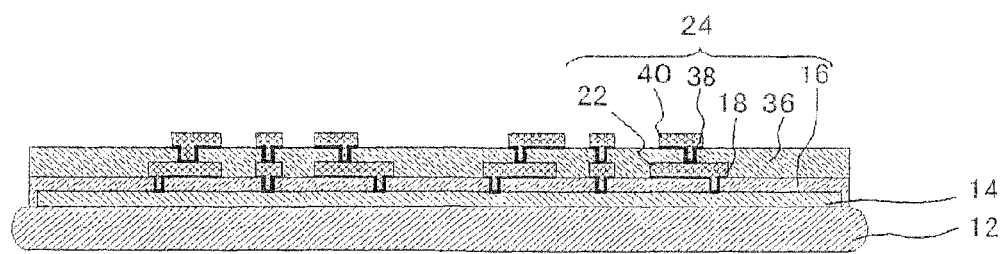
FIG. 27J is a cross-sectional view of the semiconductor device, illustrating the process for manufacturing the semiconductor device according to other embodiment.
Figure 28:
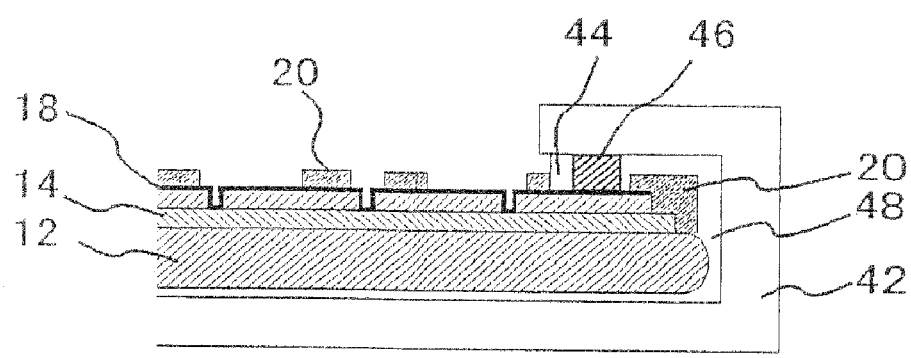
FIG. 28 is a partial cross-sectional view of the semiconductor device, illustrating a status of the support substrate, which is fixed onto a support jig in an electrolytic plating operation.

Then, the seed metal layer 14 is removed from the stripped interconnect layer 24 via an etch process (FIG. 23N). Further, an external coupling-electrode 50 is formed on a Cu plating layer of the plated film 17 exposed to be coplanar with the lower surface of the insulating film 16 (FIG. 23O). The external coupling-electrode 50 may be formed by, for example, a substitutional electroless gold plating process. After the external coupling-electrode 50 is formed, a dicing process is conducted for the spacings between the semiconductor chips 26 to obtain a plurality of structural members. On the other hand, the stripped support substrate 12 is treated similarly as described above (FIG. 12I to FIG. 12K).

Advantageous effects obtainable by employing the configuration of third embodiment will be described as follows. In a method for manufacturing the semiconductor device of the third embodiment, an advantageous effect same as the first embodiment is obtained, and further, the interface between the support substrate 12 and the seed metal layer 14 can be protected with a simple and easy method.

More specifically, in the present embodiment, the insulating film 16 composing the interconnect layer 24 functions as a protective film for protecting the interface between the support substrate 12 and the seed metal layer 14. As described above, when the insulating film 16 is employed as the protective film, the interface between the support substrate 12 and the seed metal layer 14 can be effectively protected with a simple and easy method, without a need for employing additional process operations for preparing an additional protective film. Further, since the insulating film 16 composing the interconnect layer 24 functions as a protective film, an additional interconnect layer may be prepared on the existing interconnect layer to form a multi-layered film.

While the preferred embodiments of the present invention have been described above in reference to the annexed figures, it should be understood that the disclosures above are presented for the purpose of illustrating the present invention, and various configurations other than the above described configurations can also be adopted.

For example, the stripping process of the support substrate 12 from the seed metal layer 14 by a stress or the like may be conducted before removing the resist film 20 as the protective film.

In addition, while an exemplary implementation of forming the interconnect layer 24 composed of the insulating film 16, the seed sputter film 18 and the interconnect film 22 on the seed metal layer 14 has been described in the present embodiment, an additional interconnect layer may be further formed to form a multi-layered film. In reference to third embodiment-(1), the insulating film 16, the seed sputter film 18 and the interconnect film 22 may be formed as described above (FIG. 24A to FIG. 25E), and then, an insulating film 36, a seed sputter film 38 and an interconnect film 40 may be further formed by a similar processes to provide an interconnect layer 24 having a multiple-layered structure (FIG. 25F to FIG. 27J).

In addition, the following encapsulation process may be employed in the present embodiment. In addition to above, an exemplary implementation employing a wafer, which is prepared by removing the layered portions of the stripping film 52 and the metallic film 32 formed in the circumference portion of the support substrate 12 via an etch process before the encapsulation process of second embodiment-(2), will be described.

Figure 31A:
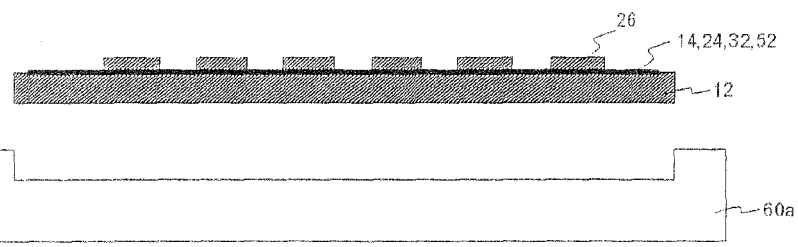
FIGS. 31A to 31C are cross-sectional views of a semiconductor device, illustrating other encapsulation process in the present embodiment.

First of all, a wafer having a seed metal layer 14, an interconnect layer 24, a metallic film 32 and a stripping film 52 formed on the support substrate 12 and having a semiconductor chip mounted thereon is disposed on a lower metal mold 60a (FIG. 31A). In addition to above, an underfill resin is not shown. Thickness of the semiconductor chip 26 is within a range of from 20 um to 800 μm.

Figure 31B:
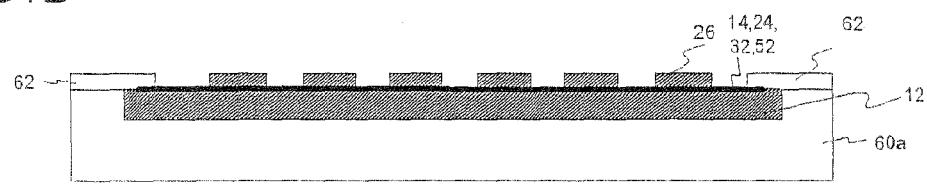

Subsequently, a ring member 62 is disposed on the support substrate 12 mounted in the lower metal mold 60a and on the lower metal mold 60a (FIG. 31B). An end portion of a circumference circle of the ring member 62 is located outside by about 1 to 10 mm from an end portion of the support substrate 12, an end portion of an internal circumference circle thereof is located inside by about 1 to 5 mm from an end portion of the support substrate 12. Thickness of the ring member 62 is about 0.05 to 2 mm. In addition, materials available for the ring member 62 may include a silica filler containing epoxy resin, a glass cloth-containing epoxy resin, a polyimide resin, a polyethylene terephthalate (PET) resin, a polycarbonate resin, stainless steel, copper, brass, aluminum, duralumin or the like.

While the following description will be made in reference to the configuration, in which the ring member 62 is disposed on both of the top surfaces of the support substrate 12 and the lower metal mold 60a, in the present embodiment, an alternative configuration of disposing the ring member 62 on only the top surface of the support substrate 12 may also be employed.

Figure 31C:
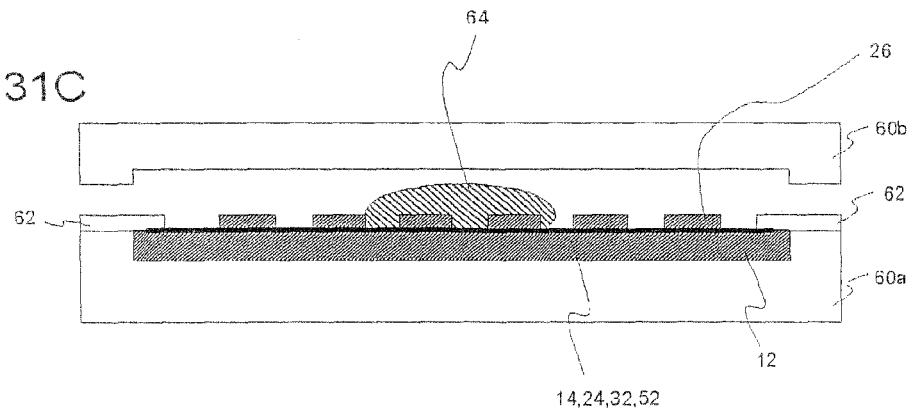
Figure 32D:
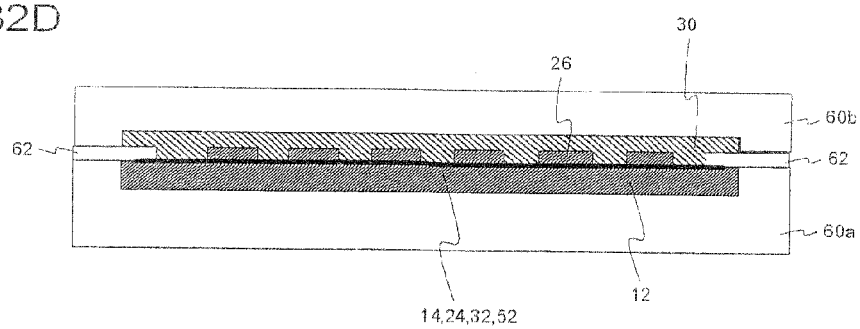
FIGS. 32D to 32F are cross-sectional views of the semiconductor device, illustrating other encapsulation process in the present embodiment.

In the ring member 62, an adhesive agent, which exhibits losing an adhesive-ability at a temperature of equal to or higher than 90 degree C., may also be applied on a surface contacting with the support substrate 12 and a surface contacting with the lower metal mold 60a. This facilitates a stripping removal of the ring member 62 in a stripping operation as discussed later. Typical "adhesive agent, which exhibits losing an adhesive-ability at a temperature of equal to or higher than 90 degree C." may be a thermal release tape "REVALPHA" (commercially available from NITTO DENKO CORPORATION), Then, an encapsulating resin 64 is supplied on the wafer, and the resin is sandwiched with an upper metal mold 60b and the lower metal mold 60a (FIG. 31C). The encapsulating resin 30 may be composed of, for example, an epoxy resin and a silica filler or the like. Then, the resin is cured under a condition of being sandwiched with the upper metal mold 60b and the lower metal mold 60a, so that a plurality of semiconductor chips 26 are encapsulated with the encapsulating resin 30 (FIG. 32D). The cure process for the encapsulating resin 64 may be conducted be heating thereof at a temperature of the upper metal mold 60b and the lower metal mold 60a of about 150 to 180 degree C. for 1 to 5 minutes.

Figure 32E:
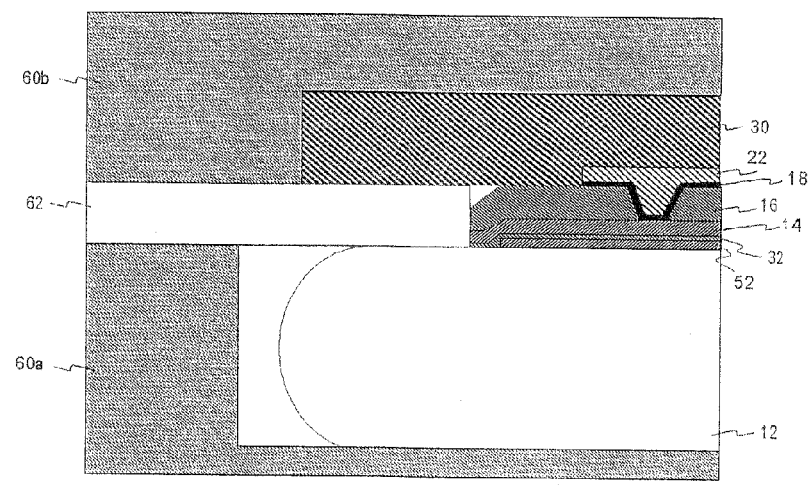

The end portion of the wafer during the cure of the resin 64 is illustrated (FIG. 32E). While a configuration, in which the end portion of the ring member 62 is in contact with the end portions of the metallic film 32, the seed metal layer 14 and the insulating film 16, is illustrated in the diagram, it is not intended to exclude configuration, in which a portion of the ring member 62 is disposed on these films.

Figure 32F:
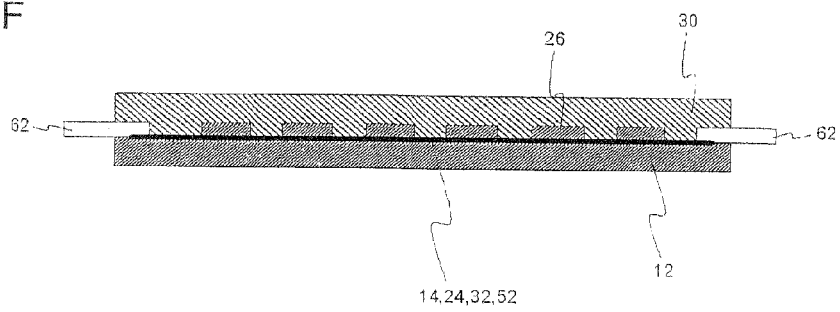
Figure 33G:
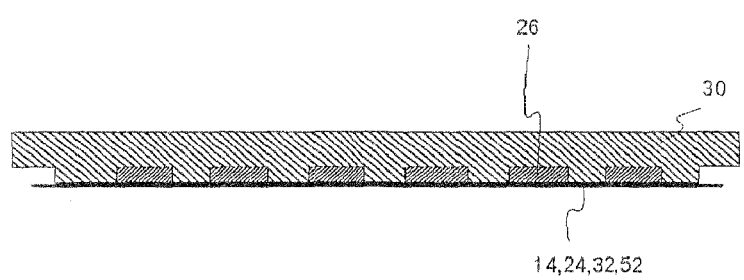
FIG. 33 is a cross-sectional view of the semiconductor device, illustrating other encapsulation process in the present embodiment.

Then, the lower metal mold 60a and the upper metal mold 60h are removed (FIG. 32F), and similarly as in second embodiment-(1), the support substrate 12 is stripped off from the stripping film 52, and further, the stripping film 52 is removed via a certain method. Further, the ring member 62 is stripped off (FIG. 33G). Then, a dicing process is conducted for the spacings between the semiconductor chips 26 to obtain a plurality of structural members.

Alternatively, in the present embodiment, the encapsulating resin 30 may be formed by the following printing operation. In addition to above, an exemplary implementation employing a wafer, which is prepared by removing the layered portions of the stripping film 52 and the metallic film 32 formed in the circumference portion of the support substrate 12 via an etch process before the encapsulation process of second embodiment-(2), will be described.

Figure 34A:
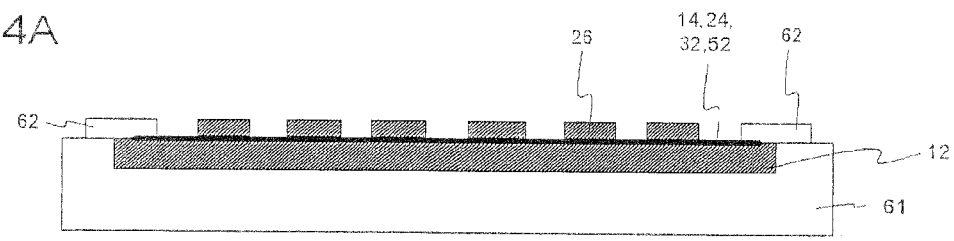
FIGS. 34A to 34C are cross-sectional views of a semiconductor device, illustrating a printing operation in the present embodiment.

First of all, a wafer having a seed metal layer 14, an interconnect layer 24, a metallic film 32 and a stripping film 52 formed on the support substrate 12 and having a semiconductor chip mounted thereon is disposed on a stage 61 of a printing machine (FIG. 34A). In addition to above, an underfill resin is not shown. Thickness of the semiconductor chip 26 is within a range of from 20 μm to 800 μm. Subsequently, a ring member 62 is disposed on the support substrate 12 mounted in the printing machine stage 61 and on the lower metal mold 60a (FIG. 34A). The materials described above may be employed for the ring member 62.

Alternatively, similarly as described above, in the ring member 62, an adhesive agent, which exhibits losing an adhesive-ability at a temperature of equal to or higher than 90 degree C., may also be applied on a surface contacting with the support substrate 12 and a surface contacting with the printing machine stage 61. This facilitates a stripping removal of the ring member 62 in a stripping operation as discussed later. Typical "adhesive agent, which exhibits losing an adhesive-ability at a temperature of equal to or higher than 90 degree C." may be a thermal release tape "REVALPEA" (commercially available from NITTO DENKO CORPORATION).

While the following description will be made in reference to the configuration, in which the ring member 62 is disposed on both of the top surfaces of the support substrate 12 and the printing machine stage 61 in the present embodiment, an alternative configuration of disposing the ring member 62 on only the top surface of the support substrate 12 may also be employed.

Figure 34B:
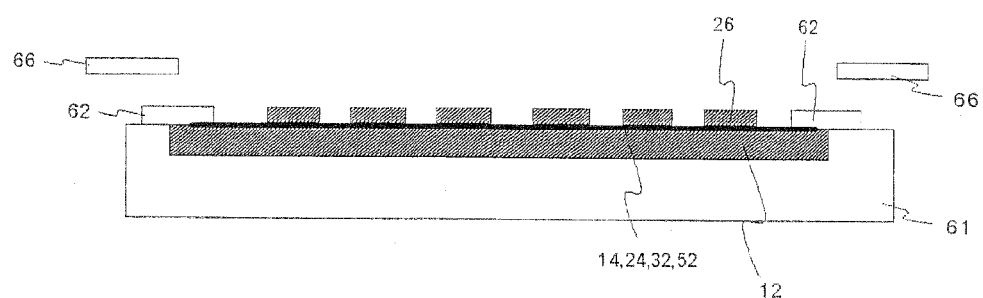

Then, a ring-shaped printing mask 66 is disposed on the ring member 62. An aperture (internal circumference circle) of the printing mask may be designed so that the size of the encapsulating resin 30 would be substantially the same as the size of the support substrate 12, after the printing process is completed (FIG. 34B).

Figure 34C:
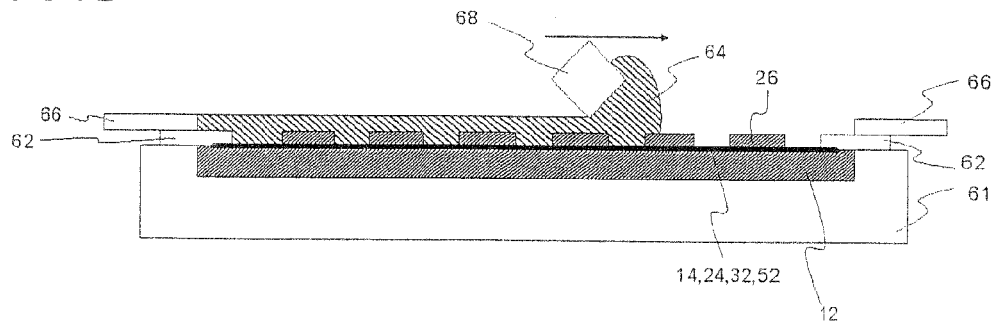

Subsequently, the encapsulating resin 64 is printed by employing a squeegee 68 (FIG. 34C). In the printing process, an atmosphere around the support substrate 12 may be reduced to a vacuum, for reducing voids in the encapsulating resin 64.

Figure 35D:
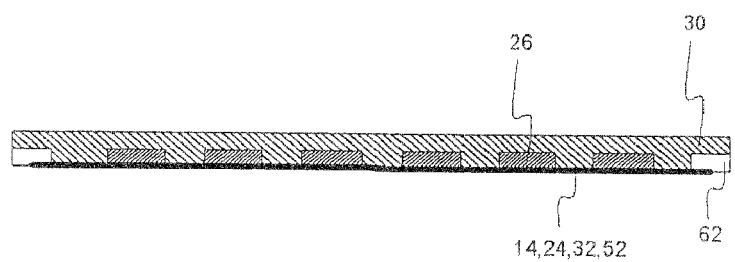
FIGS. 35D and 35E are cross-sectional views of the semiconductor device, illustrating the printing operation in the present embodiment.
Figure 35E:
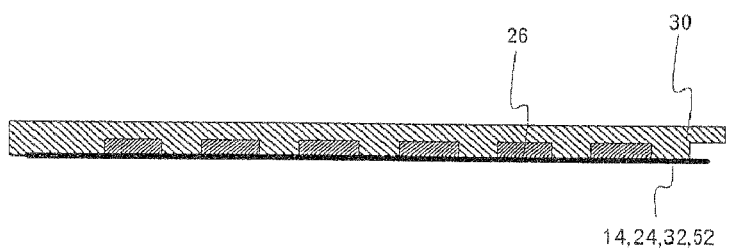

After the printing is completed, the support substrate 12 is unloaded from the printing machine stage 61, and then the substrate is heated to a temperature of about 120 degree C. for about 4 hours to carry out a cure process for the encapsulating resin 64. Thereafter, the support substrate 12 is stripped off from the stripping film 52, and further, the stripping film 52 is removed via a certain method. Then, portions of the ring member 62 protruding from the encapsulating resin 30 may be cut off with a cutter or laser beam (FIG. 35D), or may be torn off from the encapsulating resin 30 (FIG. 35E). Then, a dicing process is conducted for the spacings between the semiconductor chips 26 to obtain a plurality of structural members.

According to the method for forming the encapsulating resin 30 described above, the encapsulating resin 30 can be formed to have a dimension that is substantially the same as the dimension of the support substrate 12. "Having the size that is substantially the same as the dimension of the support substrate 12" means that the encapsulating resin has a dimension, which can be treated in a transportation system in the manufacturing apparatus, which is employed for handling the support substrate 12, without a need for changing dimensions in the apparatus. More specifically, it is meant to be within semiconductor equipment and materials international (SEMI) standard or within a range of +/−500 μm from the size of the support substrate 12 in most of commercially available apparatus. By providing the encapsulating resin 30 having the dimension that is substantially the same as the dimension of the support substrate 12, the apparatus for the support can be commonly utilized for these applications without a need for modifying the manufacture apparatus such as a mounter and the like. On the contrary, when the dimension of the support substrate 12 is different from the dimension of the encapsulating resin 30, several jigs having different dimensions is required or a change in control software is required in the transfer of the substrate or in the chucking of the substrate.

Figure 36:
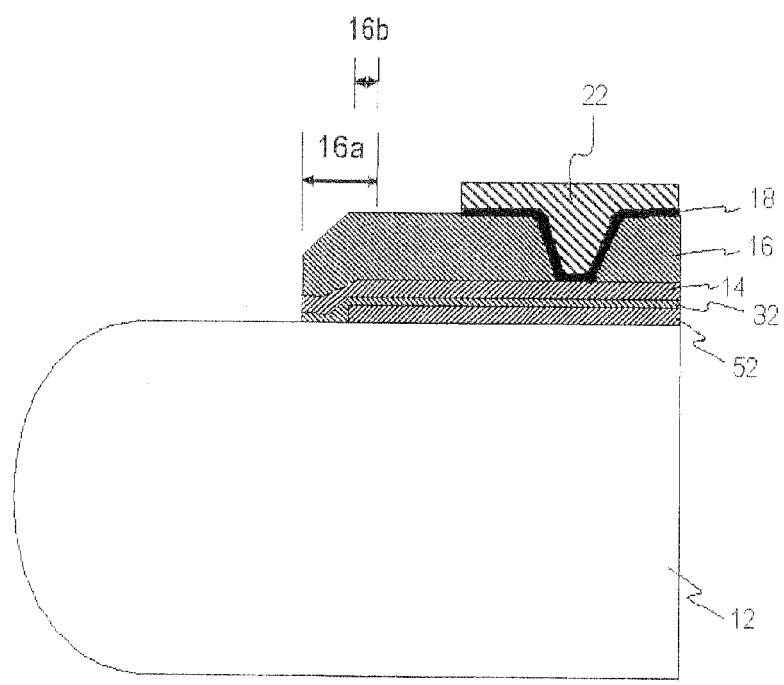
FIG. 36 is a cross-sectional view of a semiconductor device, illustrating a method for preparing a stripping starting point in the present embodiment.

In the semiconductor device, in which the dimension of the support substrate 12 and the dimension of the encapsulating resin 30 are almost the same, as described above, processing range 16a or 16b of the insulating film 16 composed of a polyimide resin may be removed via a laser beam or a mechanical processing to form a stripping starting point (FIG. 36).

Figure 37:
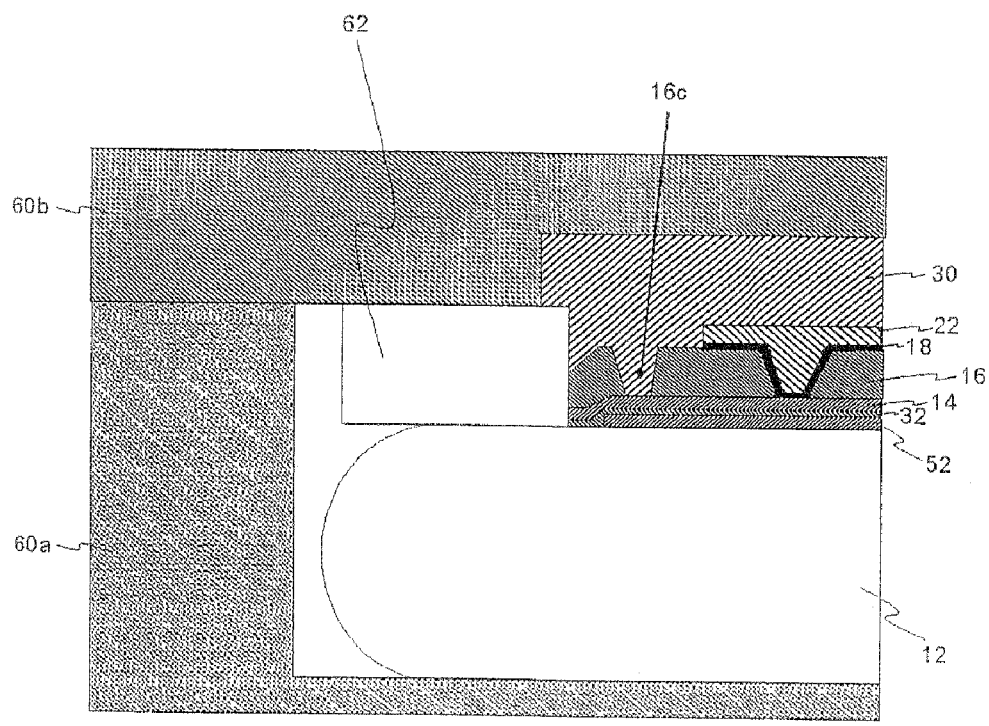
FIG. 37 is a cross-sectional view of a semiconductor device, illustrating an encapsulation process after preparing the stripping starting point in the present embodiment.

When a slit 16c is prepared as a stripping starting point in the insulating film 16 in the processing range 16a, the support substrate 12 can be encapsulated with the encapsulating resin 30, as shown in FIG. 37. Further, stripping process is conducted after the encapsulating process, an upward force is added over the ring member 62 to cause the stripping. Since the ring member 62 is not in closely contact with the seed metal 14 and the insulating film 16, the stripping is commenced once a stress concentrates on the end portion "A" shown in FIG. 38. When the slit 16c is formed via a laser processing, the stripping layer 52 is easily stripped off from the surface of the support substrate 12 due to an elevated temperature in the processing. In addition to above, it is empirically confirmed that the adhesive force of the stripping layer 52 is reduced at a temperature of equal to or higher than 350 degree C.

Figure 39:
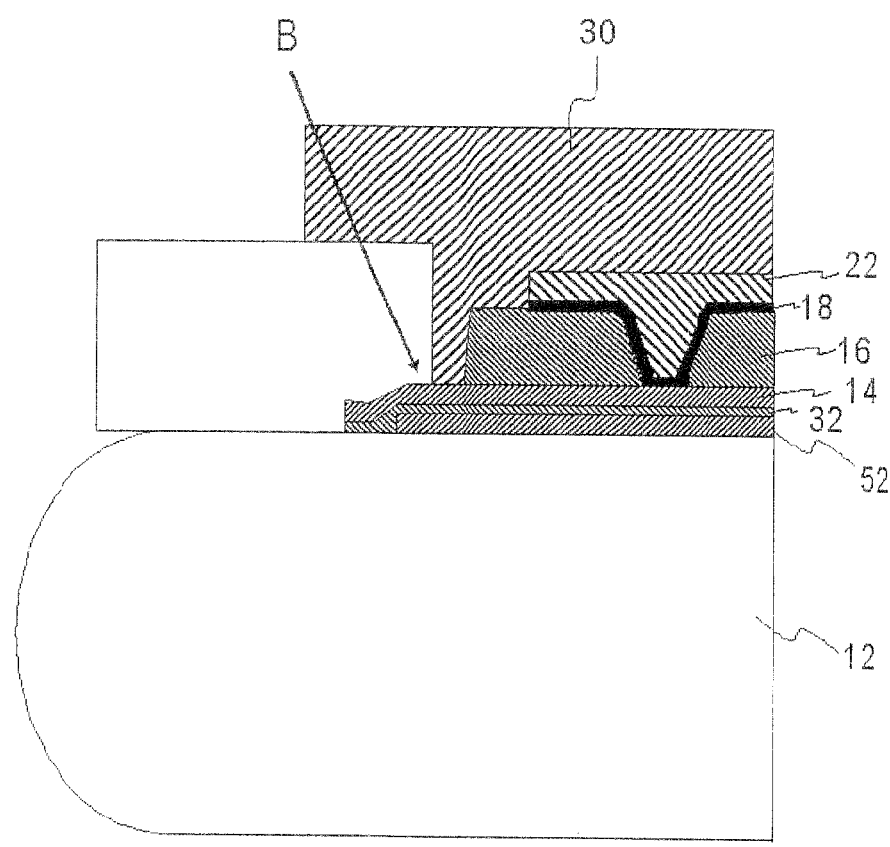
FIG. 39 is a cross-sectional view of the semiconductor device, illustrating the condition of the end portion of the semiconductor device, which includes the stripping starting point in the present embodiment.

On the other hand, in the processing range 16b, when the insulating film 16 is removed to prepare a stripping starting point, a portion of the ring member 62 may be disposed on the seed metal layer 14 and then an encapsulation with the encapsulating resin 30 may be conducted, as shown in FIG. 39. Further, when the stripping process is conducted after the encapsulating process, an upward force is added over the ring member 62 to cause the stripping. Since the ring member 62 is not in closely contact with the seed metal 14, the stripping is commenced once a stress concentrates on the end portion "B" shown in FIG. 39. When the removal of the insulating film 16 is employed, the stripping layer 52 is easily stripped off from the surface of the support substrate 12 due to an elevated temperature in the processing. In addition to above, it is empirically confirmed that the adhesive force of the stripping layer 52 is reduced at a temperature of equal to or higher than 350 degree C. In addition, water may be introduced from the starting point to facilitate the stripping process.

Figure 40:
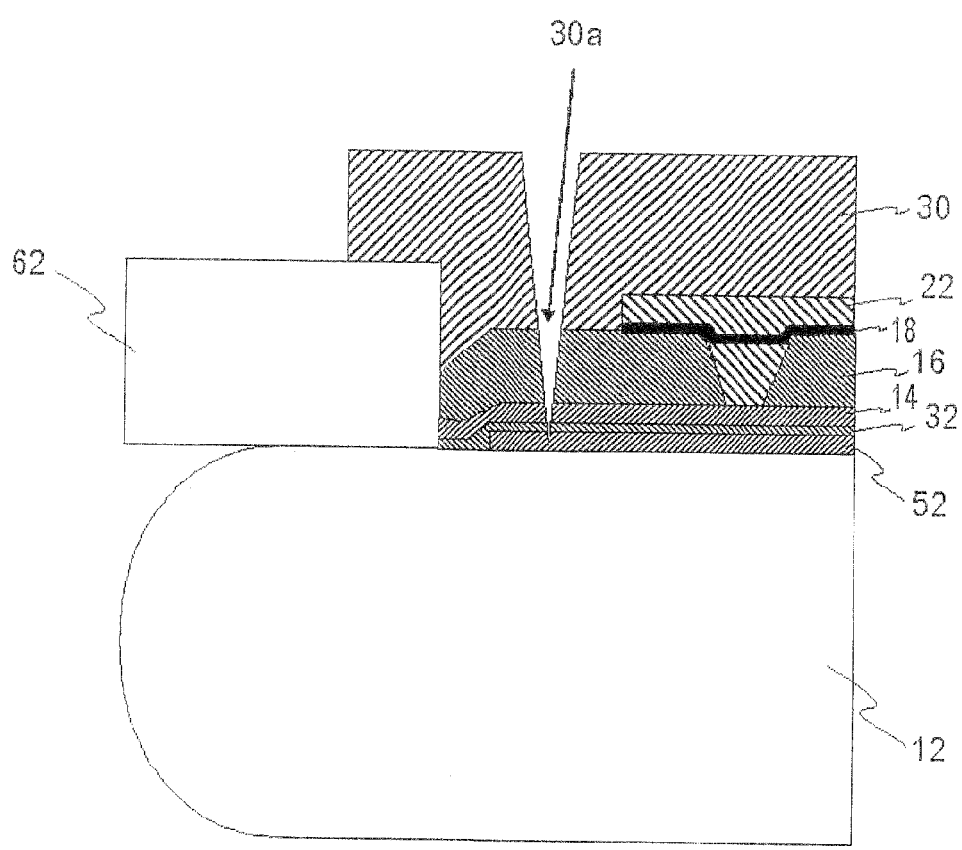
FIG. 40 is a cross-sectional view of a semiconductor device, showing a position for preparing a stripping starting point in the present embodiment.

In addition, as shown in FIG. 40, after the encapsulating resin 30 is formed, a slit 30a is formed from the surface of the encapsulating resin 30 with laser beam and a cutter until the slit extends through the stripping layer 52 to form a stripping starting point. Thereafter, a liquid material that is capable of promoting the stripping such as water and the like may be penetrated into the interface between the stripping layer and the support substrate 12, so that the support substrate can also be easily stripped from the seed metal layer.

Figure 41:
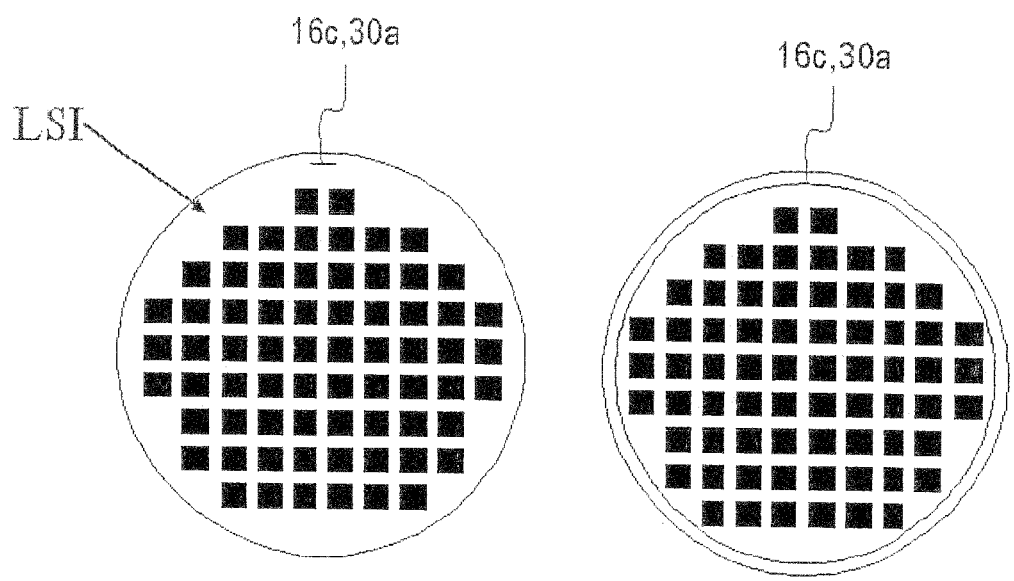
FIG. 41 includes plan-views of wafers in the present embodiment.
Figure 42A:
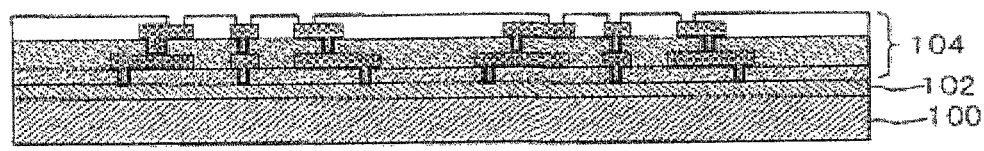
FIGS. 42A and 42B are cross-sectional views of a semiconductor device, illustrating a process for manufacturing a conventional semiconductor device.
Figure 42B:
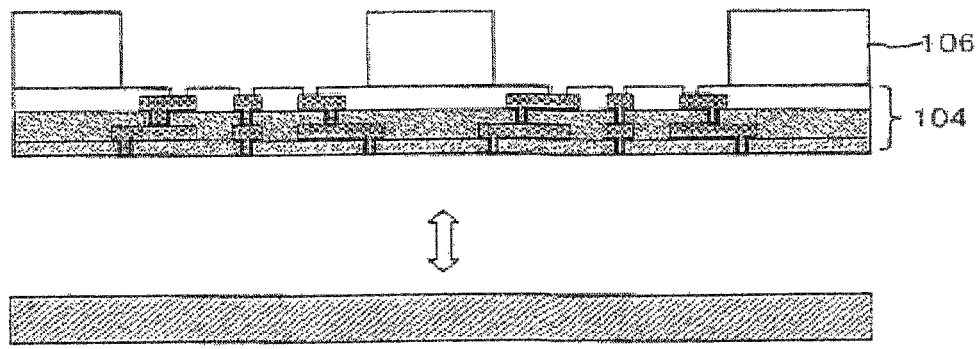

A position for preparing the stripping starting point will be described in reference to FIG. 41. FIG. 41 includes plan views of a wafer in the present embodiment, and a diagram in the left is a plan view of the wafer for describing that the stripping starting point is formed in a portion of the wafer. An arbitrary width may be selected for the width of the stripping starting point, provided that the selected width is equal to or longer than a minimum diameter available in the employed processing method. A diagram in the right is a plan view of the wafer for describing that the stripping starting point is formed over the whole circumference of the wafer circumference portion.

Figure 38:
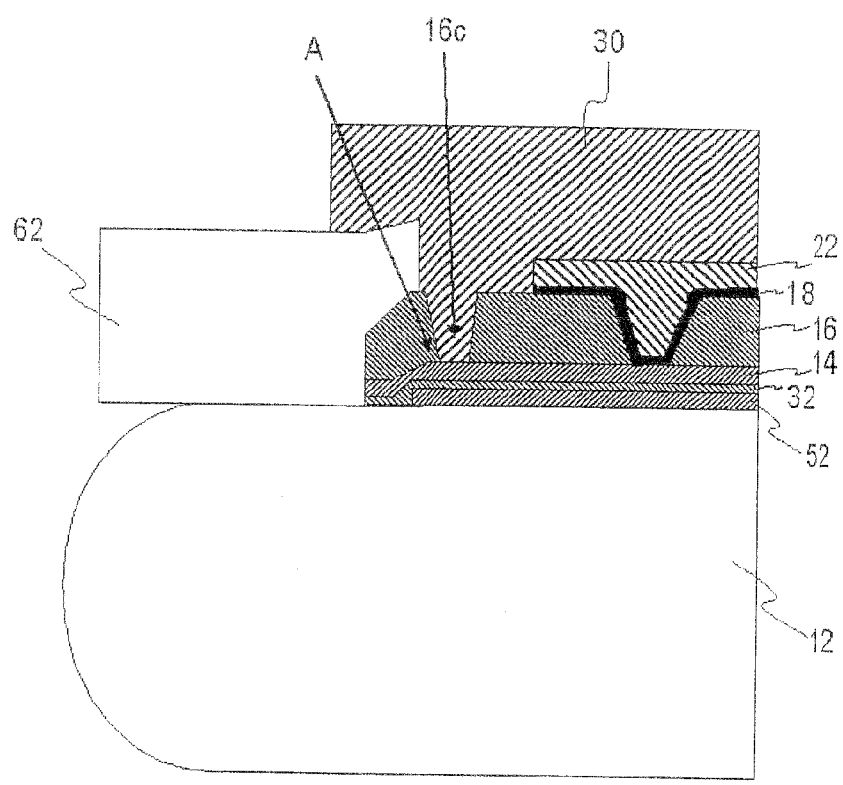
FIG. 38 is a cross-sectional view of a semiconductor device, illustrating a condition of an end portion of the semiconductor device, which includes a stripping starting point in the present embodiment.

Concerning the slit 16c shown in FIG. 38, the slit 16c may be formed to be within a portion of the wafer to form the stripping starting point (diagram in the left of FIG. 41), or may be formed over the whole circumference of the wafer circumference portion to form the stripping starting point (diagram in the right of FIG. 41). When the insulating film 16 is removed in the processing range 16b as shown in FIG. 39, the stripping starting point is formed over the whole circumference of the wafer circumference portion (diagram in the right of FIG. 41). On the other hand, concerning the slit 30a shown in FIG. 40, the slit 30a may be formed to be within a portion of the wafer to form the stripping starting point (diagram in the left of FIG. 41), or may be formed over the whole circumference of the wafer circumference portion to form the stripping starting point (diagram in the right of FIG. 41). In the case of forming the slit 30a as shown in FIG. 40, when the support substrate 12 is reused, the position for forming the slit may be moved in every reuses. Having such configuration, even if a scratch is formed in the surface of the support substrate 12 in the process for forming the slit, the stripping operation is not influenced by such scratch.

It is apparent that the present invention is not limited to the above embodiment, and may be modified and changed without departing from the scope and spirit of the invention.

What is claimed is:

1. A method for manufacturing a semiconductor device, comprising:
    forming an interconnect film, by forming a protective film composed of a metal on a top surface of a support substrate, by forming a seed metal layer contacting at least a portion of said protective film, and by growing a plated material from a surface of said seed metal layer;
    mounting a semiconductor chip on said interconnect film;
    forming a region where said support substrate is exposed by removing said protective film; and
    stripping said support substrate from said region as a starting point to remove thereof from said seed metal layer,
    wherein said protective film is a metal which exhibits higher adhesiveness with the surface of said support substrate than a metal composing said seed metal layer.

2. The method for manufacturing the semiconductor device according to claim 1, wherein said forming said interconnect film includes:
    forming the protective film with the metal that is different from the metal composing said seed metal layer so as to cover a circumference portion on said top surface of said support substrate, and then forming said seed metal layer contacting said top surface of said support substrate and at least a portion of said lateral end of said protective film, and subsequently, forming the interconnect film by growing a plated material from the surface of said seed metal layer.

3. The method for manufacturing the semiconductor device according to claim 2, wherein said forming said interconnect film includes:
    forming an insulating film over said seed metal layer between said forming said seed metal layer and said forming said interconnect film,
    wherein an end in-plane direction of said protective film is located inside of a circumference end of said insulating film.

4. The method for manufacturing the semiconductor device according to claim 2, wherein said forming said interconnect film includes:
    disposing said protective film between said support substrate and said seed metal layer by forming said seed metal layer after forming said protective film, and subsequently, forming the interconnect film by growing a plated material from the surface of said seed metal layer.

5. The method for manufacturing the semiconductor device according to claim 2, wherein said forming said interconnect film includes:
    forming said protective film having a plated film, which provides an electrical connection with said seed metal layer, embedded in an aperture so as to cover said seed metal layer and to be in contact with said support substrate;
    forming a seed sputter film, which being electrically connection with said plated film, on said insulating film; and
    forming the interconnect film by growing a plated material from a surface of said seed sputter film.

6. The method for manufacturing the semiconductor device according to claim 1, wherein said forming said interconnect film includes:
    forming the protective film with the metal that is different from the metal composing said seed metal layer so as to cover a circumference portion of said support substrate, and forming a stripping film that is in contact with said protective film in an end thereof; and
    forming said seed metal layer on top surfaces of said protective film and said stripping film to expose a circumference end of said protective film and subsequently forming the interconnect film by growing a plated material from the surface of said seed metal layer.

7. The method for manufacturing the semiconductor device according to claim 6, wherein said forming said interconnect film includes:
    forming an insulating film over said seed metal layer between said forming said seed metal layer and said forming said interconnect film,
    wherein a circumference end of said stripping film is located inside of a circumference end of said insulating film.

8. The method for manufacturing the semiconductor device according to claim 6, wherein said stripping film contains copper (II) oxide (CuO), copper (I) oxide (Cu2O), copper nitride (CuN), titanium dioxide (TiO2) or copper (Cu).

9. The method for manufacturing the semiconductor device according to claim 6, wherein said stripping film is formed on said support substrate and said protective film is formed on said stripping film and said circumference portion of a top surface of said support substrate.

10. The method for manufacturing the semiconductor device according to claim 1, wherein the metal composing said protective film is aluminum (AI), titanium (Ti), tantalum (Ta), chromium (Cr), titanium nitride (TiN), titanium-tungsten alloy (TiW), tantalum nitride (TaN) or tantalum (IV) oxide (TaO2).

11. The method for manufacturing the semiconductor device according to claim 1, wherein said forming said interconnect film includes:
    forming a stripping film on the surface of the support substrate except a circumference portion thereof;
    forming said protective film with a metal that is different from the metal composing said seed metal layer so as to cover said stripping film and at least a part of said circumference portion of the support substrate;
    forming said seed metal on top surfaces of said protective film and said stripping film; and
    subsequently forming the interconnect film by growing a plated material from the surface of said seed metal layer.

12. The method for manufacturing the semiconductor device according to claim 11, wherein said protective film is not formed in the circumference region that is internal by a predetermined distance from the end portion of the support substrate.

13. The method for manufacturing the semiconductor device according to claim 11, wherein stripping said support substrate includes:
    stripping said support substrate from said stripping film; and
    removing said stripping film.

14. A method for manufacturing a semiconductor device, comprising:
    forming a protective film so as to cover a circumference portion of a top surface of a support substrate;

forming a seed metal layer physically contacting with said top surface of said support substrate and a lateral end of said protective film;

forming an interconnect film by growing a plated material from a surface of said seed metal layer;

mounting a semiconductor chip on said interconnect film;

forming a region where said support substrate and said seed metal layer are exposed by removing at least a portion of said protective film; and stripping said support substrate from said region as a starting point to remove thereof from said seed metal layer, wherein said protective film is a metal which exhibits higher adhesiveness with the surface of said support substrate than a metal composing said seed metal layer.

15. The method for manufacturing the semiconductor device according to claim 14, wherein said protective film is composed of the metal that is different from the metal composing said seed metal layer.

16. The method for manufacturing the semiconductor device according to claim 14, further comprising:

forming an insulating film over said seed metal layer between said forming said seed metal layer and said forming said interconnect film, wherein an end in-plane direction of said protective film is located inside of a circumference end of said insulating film.

17. A method for manufacturing a semiconductor device, comprising:

forming an interconnect film, by forming a seed metal layer physically contacting a support substrate and a protective film composed of a metal contacting with an end of an interface between said support substrate and said seed metal layer, and by growing a plated material from a surface of said seed metal layer;

mounting a semiconductor chip on said interconnect film;

forming a region where said support substrate and said seed metal layer are exposed by removing at least a portion of said protective film; and stripping said support substrate from said region as a starting point to remove thereof from said seed metal layer, wherein said protective film exhibits higher adhesiveness with a surface of said support substrate than a metal composing said seed metal layer.

* * * * *